US012630925B2

(12) United States Patent
Thomas et al.

(10) Patent No.: US 12,630,925 B2
(45) Date of Patent: May 19, 2026

(54) DUAL PLENUM FRACTAL SHOWERHEAD

(71) Applicant: Lam Research Corporation, Fremont, CA (US)

(72) Inventors: Clint Edward Thomas, Newark, CA (US); Jeremy Todd Tucker, Mountain View, CA (US); Alan M. Schoepp, Ben Lomond, CA (US)

(73) Assignee: Lam Research Corporation, Fremont, CA (US)

( * ) Notice: Subject to any disclaimer, the term of this patent is extended or adjusted under 35 U.S.C. 154(b) by 697 days.

(21) Appl. No.: 17/754,853

(22) PCT Filed: Oct. 13, 2020

(86) PCT No.: PCT/US2020/055430
§ 371 (c)(1),
(2) Date: Apr. 13, 2022

(87) PCT Pub. No.: WO2021/076527
PCT Pub. Date: Apr. 22, 2021

(65) Prior Publication Data
US 2024/0295025 A1     Sep. 5, 2024

Related U.S. Application Data

(60) Provisional application No. 62/914,616, filed on Oct. 14, 2019.

(51) Int. Cl.
C23C 16/455      (2006.01)
C23C 16/458      (2006.01)

(52) U.S. Cl.
CPC .... C23C 16/45565 (2013.01); C23C 16/4583 (2013.01)

(58) Field of Classification Search
None
See application file for complete search history.

(56)                References Cited

U.S. PATENT DOCUMENTS 5,597,439  A      1/1997  Salzman
5,614,026  A      3/1997  Williams
            (Continued)

FOREIGN PATENT DOCUMENTS

CN          1574229  A      2/2005
CN        101003895  A      7/2007
            (Continued)

OTHER PUBLICATIONS

Cao, et al., "Development of a scanning probe microscopy integrated atomic layer deposition system for in situ successive monitoring of thin film growth" Review of Scientific Instruments 89, 123702 (2018) pp. 1-8. https://doi.org/10.1063/1.5042463.
            (Continued)

*Primary Examiner* — Jeffrie R Lund
*Assistant Examiner* — Tiffany Z Nuckols
(74) *Attorney, Agent, or Firm* — Weaver Austin Villeneuve & Sampson LLP

(57)                ABSTRACT

A dual-plenum fractal (DPF) showerhead for distributing different semiconductor processing gases across a semiconductor wafer during processing operations is provided. The DPF showerhead may have a plurality of layers, each featuring a pattern of gas distribution features, with the gas distribution features on each layer generally being similar in shape to the gas distribution features on the layer immediately therefrom but smaller in size. Such a "fractal"-like structure to the gas flow passages provides very uniform processing gas delivery across the surface of a semiconductor wafer during processing operations, thereby enhancing wafer uniformity.

20 Claims, 12 Drawing Sheets

(56) References Cited

U.S. PATENT DOCUMENTS

| | | | |
|---|---|---|---|
| 5,871,586 A | 2/1999 | Crawley et al. | |
| 5,919,382 A | 7/1999 | Qian et al. | |
| 5,994,662 A | 11/1999 | Murugesh | |
| 6,036,878 A | 3/2000 | Collins | |
| 6,054,013 A | 4/2000 | Collins et al. | |
| 6,059,885 A | 5/2000 | Ohashi et al. | |
| 6,089,182 A | 7/2000 | Hama | |
| 6,089,472 A | 7/2000 | Carter | |
| 6,148,761 A | 11/2000 | Majewski et al. | |
| 6,200,412 B1 | 3/2001 | Kilgore et al. | |
| 6,205,869 B1 | 3/2001 | Schadt et al. | |
| 6,251,188 B1 | 6/2001 | Hashimoto et al. | |
| 6,291,793 B1 | 9/2001 | Qian et al. | |
| 6,306,247 B1 | 10/2001 | Lin | |
| 6,364,949 B1 | 4/2002 | Or et al. | |
| 6,387,182 B1 | 5/2002 | Horie et al. | |
| 6,387,207 B1 | 5/2002 | Janakiraman et al. | |
| 6,444,039 B1 | 9/2002 | Nguyen | |
| 6,502,530 B1 * | 1/2003 | Turlot | C23C 16/45565 |
| | | | 156/345.43 |
| 6,537,419 B1 | 3/2003 | Kinnard | |
| 6,565,661 B1 | 5/2003 | Nguyen | |
| 6,616,767 B2 | 9/2003 | Zhao et al. | |
| 6,635,117 B1 | 10/2003 | Kinnard et al. | |
| 6,727,654 B2 | 4/2004 | Ogawa et al. | |
| 6,782,843 B2 | 8/2004 | Kinnard et al. | |
| 6,820,570 B2 | 11/2004 | Kilpela et al. | |
| 6,921,437 B1 | 7/2005 | DeDontney et al. | |
| 7,156,921 B2 | 1/2007 | Byun | |
| 7,186,395 B2 | 3/2007 | Walsdorff et al. | |
| 7,296,534 B2 | 11/2007 | Fink | |
| 7,479,303 B2 | 1/2009 | Byun | |
| 7,601,242 B2 | 10/2009 | Fink | |
| 7,846,291 B2 | 12/2010 | Otsuki | |
| 7,850,779 B2 | 12/2010 | Ma et al. | |
| 7,931,749 B2 | 4/2011 | Amikura et al. | |
| 7,976,631 B2 | 7/2011 | Burrows et al. | |
| 8,057,600 B2 | 11/2011 | Nishimoto et al. | |
| 8,083,853 B2 | 12/2011 | Choi et al. | |
| 8,187,679 B2 | 5/2012 | Dickey et al. | |
| 8,231,799 B2 | 7/2012 | Bera et al. | |
| 8,298,370 B2 | 10/2012 | Byun | |
| 8,308,865 B2 | 11/2012 | Kim et al. | |
| 8,328,939 B2 | 12/2012 | Choi et al. | |
| 8,361,275 B2 | 1/2013 | Tahara et al. | |
| 8,361,892 B2 | 1/2013 | Tam et al. | |
| 8,419,959 B2 | 4/2013 | Bettencourt et al. | |
| 8,512,509 B2 | 8/2013 | Bera et al. | |
| 8,562,785 B2 | 10/2013 | Kang et al. | |
| 8,608,852 B2 | 12/2013 | Mahadeswaraswamy et al. | |
| 8,679,956 B2 | 3/2014 | Tam et al. | |
| 8,721,791 B2 | 5/2014 | Tiner et al. | |
| 8,764,902 B2 | 7/2014 | Suzuki et al. | |
| 8,869,742 B2 | 10/2014 | Dhindsa et al. | |
| 8,882,913 B2 | 11/2014 | Byun et al. | |
| 9,057,128 B2 | 6/2015 | Olgado | |
| 9,132,436 B2 | 9/2015 | Liang et al. | |
| 9,224,581 B2 | 12/2015 | Mai et al. | |
| 9,315,897 B2 | 4/2016 | Byun et al. | |
| 9,349,619 B2 | 5/2016 | Kawamata et al. | |
| 9,441,791 B2 | 9/2016 | Mizusawa et al. | |
| 9,447,499 B2 | 9/2016 | Roy et al. | |
| 9,476,121 B2 | 10/2016 | Byun et al. | |
| 9,677,176 B2 | 6/2017 | Chandrasekharan et al. | |
| 9,892,908 B2 | 2/2018 | Pettinger et al. | |
| 9,978,564 B2 | 5/2018 | Liang et al. | |
| 10,023,959 B2 | 7/2018 | Sung et al. | |
| 10,077,497 B2 | 9/2018 | Tucker et al. | |
| 10,312,113 B2 * | 6/2019 | Terada | H01L 21/6719 |
| 10,316,409 B2 | 6/2019 | Van Schravendijk | |
| 10,494,717 B2 | 12/2019 | Sung et al. | |
| 10,604,841 B2 | 3/2020 | Batzer et al. | |
| 11,053,587 B2 | 7/2021 | Van Schravendijk | |
| 11,101,164 B2 | 8/2021 | Batzer et al. | |
| 11,608,559 B2 | 3/2023 | Batzer et al. | |
| 12,000,047 B2 | 6/2024 | Batzer et al. | |
| 12,331,402 B2 | 6/2025 | Batzer et al. | |
| 2002/0017243 A1 | 2/2002 | Pyo | |
| 2002/0059904 A1 | 5/2002 | Doppelhammer | |
| 2002/0179012 A1 | 12/2002 | Takatsu et al. | |
| 2003/0010451 A1 | 1/2003 | Tzu et al. | |
| 2003/0019580 A1 | 1/2003 | Strang | |
| 2003/0051665 A1 | 3/2003 | Zhao et al. | |
| 2003/0054099 A1 | 3/2003 | Jurgensen et al. | |
| 2003/0077388 A1 | 4/2003 | Byun | |
| 2003/0151114 A1 | 8/2003 | Zyl | |
| 2003/0205328 A1 | 11/2003 | Kinnard et al. | |
| 2004/0031565 A1 | 2/2004 | Su et al. | |
| 2004/0050326 A1 | 3/2004 | Thilderkvist et al. | |
| 2004/0082251 A1 | 4/2004 | Bach et al. | |
| 2004/0134611 A1 | 7/2004 | Kato et al. | |
| 2004/0216665 A1 | 11/2004 | Soininen et al. | |
| 2004/0216844 A1 | 11/2004 | Janakiraman et al. | |
| 2004/0226507 A1 | 11/2004 | Carpenter et al. | |
| 2005/0000430 A1 | 1/2005 | Jang et al. | |
| 2005/0092248 A1 | 5/2005 | Lee et al. | |
| 2005/0241579 A1 | 11/2005 | Kidd | |
| 2005/0241763 A1 | 11/2005 | Huang et al. | |
| 2005/0241765 A1 | 11/2005 | Dhindsa et al. | |
| 2005/0241767 A1 | 11/2005 | Ferris et al. | |
| 2006/0011298 A1 | 1/2006 | Lim et al. | |
| 2006/0021703 A1 | 2/2006 | Umotoy et al. | |
| 2006/0112876 A1 | 6/2006 | Choi et al. | |
| 2006/0169201 A1 | 8/2006 | Hwang et al. | |
| 2006/0191637 A1 | 8/2006 | Zajac et al. | |
| 2006/0228496 A1 | 10/2006 | Choi et al. | |
| 2006/0263522 A1 | 11/2006 | Byun | |
| 2007/0068798 A1 | 3/2007 | Honda et al. | |
| 2007/0089817 A1 | 4/2007 | Ganguli et al. | |
| 2007/0110918 A1 | 5/2007 | Yuda et al. | |
| 2007/0163440 A1 | 7/2007 | Kim et al. | |
| 2007/0193515 A1 | 8/2007 | Jeon et al. | |
| 2007/0202701 A1 | 8/2007 | Nakaya et al. | |
| 2007/0215048 A1 | 9/2007 | Suzuki et al. | |
| 2007/0264427 A1 | 11/2007 | Shinriki et al. | |
| 2007/0272154 A1 | 11/2007 | Amikura et al. | |
| 2008/0017315 A1 | 1/2008 | Fukuchi | |
| 2008/0020146 A1 | 1/2008 | Choi et al. | |
| 2008/0081114 A1 * | 4/2008 | Johanson | C23C 16/45565 |
| | | | 427/273 |
| 2008/0081124 A1 | 4/2008 | Sano et al. | |
| 2008/0092815 A1 | 4/2008 | Chen et al. | |
| 2008/0093341 A1 | 4/2008 | Turlot et al. | |
| 2008/0124463 A1 | 5/2008 | Bour et al. | |
| 2008/0156264 A1 | 7/2008 | Fair et al. | |
| 2008/0156631 A1 | 7/2008 | Fair et al. | |
| 2008/0216747 A1 | 9/2008 | Wieder et al. | |
| 2009/0008034 A1 | 1/2009 | Tahara et al. | |
| 2009/0095222 A1 | 4/2009 | Tam et al. | |
| 2009/0095621 A1 | 4/2009 | Kao et al. | |
| 2009/0098276 A1 | 4/2009 | Burrows et al. | |
| 2009/0169744 A1 | 7/2009 | Byun et al. | |
| 2009/0178615 A1 | 7/2009 | Kim et al. | |
| 2009/0178616 A1 | 7/2009 | Byun | |
| 2009/0202721 A1 | 8/2009 | Nogami et al. | |
| 2009/0223449 A1 | 9/2009 | Ishida | |
| 2009/0236313 A1 | 9/2009 | Qiu et al. | |
| 2009/0266911 A1 | 10/2009 | Kim et al. | |
| 2009/0320756 A1 | 12/2009 | Tanaka | |
| 2010/0003405 A1 | 1/2010 | Käppeler | |
| 2010/0003406 A1 | 1/2010 | Lam et al. | |
| 2010/0048028 A1 | 2/2010 | Rasheed et al. | |
| 2010/0184298 A1 | 7/2010 | Dhindsa | |
| 2010/0206845 A1 | 8/2010 | Hashimoto et al. | |
| 2010/0261340 A1 | 10/2010 | Nijhawan et al. | |
| 2010/0263588 A1 | 10/2010 | Zhiyin | |
| 2010/0272895 A1 | 10/2010 | Tsuda | |
| 2010/0300359 A1 | 12/2010 | Armour et al. | |
| 2011/0003087 A1 | 1/2011 | Soininen et al. | |
| 2011/0023782 A1 | 2/2011 | Han | |
| 2011/0039402 A1 | 2/2011 | Yamazaki et al. | |
| 2011/0048325 A1 | 3/2011 | Choi et al. | |
| 2011/0052833 A1 | 3/2011 | Hanawa et al. | |
| 2011/0065276 A1 | 3/2011 | Ganguly et al. | |

(56) References Cited

U.S. PATENT DOCUMENTS

| | | |
|---|---|---|
| 2011/0073038 A1 | 3/2011 | Chien et al. |
| 2011/0088847 A1 | 4/2011 | Law et al. |
| 2011/0097492 A1 | 4/2011 | Kerr et al. |
| 2011/0226181 A1 | 9/2011 | Yamamoto |
| 2011/0253044 A1 | 10/2011 | Tam et al. |
| 2011/0256315 A1 | 10/2011 | Tam et al. |
| 2011/0256692 A1 | 10/2011 | Tam et al. |
| 2011/0308551 A1 | 12/2011 | Chung et al. |
| 2012/0052216 A1 | 3/2012 | Hanawa et al. |
| 2012/0067971 A1 | 3/2012 | Byun et al. |
| 2012/0135609 A1 | 5/2012 | Yudovsky et al. |
| 2012/0161405 A1 | 6/2012 | Mohn et al. |
| 2012/0225564 A1 | 9/2012 | Adachi et al. |
| 2012/0234945 A1 | 9/2012 | Olgado |
| 2012/0269968 A1 | 10/2012 | Rayner, Jr. |
| 2012/0321910 A1 | 12/2012 | Sneh |
| 2013/0052804 A1 | 2/2013 | Song |
| 2013/0093146 A1 | 4/2013 | Aihara et al. |
| 2013/0109159 A1 | 5/2013 | Carlson |
| 2013/0288485 A1 | 10/2013 | Liang et al. |
| 2013/0315795 A1* | 11/2013 | Bera .................. H01J 37/3244 |
| | | 422/310 |
| 2013/0341433 A1 | 12/2013 | Roy et al. |
| 2014/0041805 A1 | 2/2014 | Kuga et al. |
| 2014/0061324 A1 | 3/2014 | Mohn et al. |
| 2014/0083614 A1* | 3/2014 | Itonaga ..................... G03F 7/36 |
| | | 156/345.33 |
| 2014/0097270 A1 | 4/2014 | Liang et al. |
| 2014/0103145 A1 | 4/2014 | White et al. |
| 2014/0127911 A1 | 5/2014 | Shih et al. |
| 2014/0179114 A1 | 6/2014 | Van Schravendijk |
| 2014/0203702 A1 | 7/2014 | Amikura et al. |
| 2014/0235069 A1 | 8/2014 | Breiling et al. |
| 2014/0272185 A1 | 9/2014 | Na et al. |
| 2014/0299681 A1 | 10/2014 | Kashyap et al. |
| 2015/0004313 A1 | 1/2015 | Byun et al. |
| 2015/0007770 A1 | 1/2015 | Chandrasekharan et al. |
| 2015/0007771 A1 | 1/2015 | Silva et al. |
| 2015/0377481 A1 | 12/2015 | Smith et al. |
| 2015/0380221 A1 | 12/2015 | Liu et al. |
| 2016/0020074 A1 | 1/2016 | Mohn et al. |
| 2016/0032453 A1 | 2/2016 | Qian et al. |
| 2016/0148789 A1 | 5/2016 | Chen et al. |
| 2016/0168705 A1 | 6/2016 | Lind |
| 2016/0340782 A1 | 11/2016 | Chandrasekharan et al. |
| 2016/0348242 A1* | 12/2016 | Sung ................. C23C 16/45574 |
| 2017/0268711 A1 | 9/2017 | Tanaka et al. |
| 2018/0340256 A1 | 11/2018 | Sung et al. |
| 2018/0347045 A1 | 12/2018 | Olsen et al. |
| 2019/0032211 A1 | 1/2019 | Tucker et al. |
| 2019/0211450 A1 | 7/2019 | Adachi et al. |
| 2019/0271081 A1 | 9/2019 | Xia et al. |
| 2019/0301013 A1 | 10/2019 | Van Schravendijk |
| 2019/0352777 A1 | 11/2019 | Shankar et al. |
| 2020/0063261 A1 | 2/2020 | Shankar et al. |
| 2020/0087789 A1 | 3/2020 | Mustafa et al. |
| 2020/0279721 A1* | 9/2020 | White ............... C23C 16/45574 |
| 2020/0291522 A1* | 9/2020 | Panavalappil Kumarankutty ....... |
| | | C23C 16/45565 |
| 2021/0371982 A1 | 12/2021 | Batzer et al. |
| 2023/0090368 A1 | 3/2023 | Roberts et al. |
| 2023/0140263 A1 | 5/2023 | Lakshmana et al. |
| 2023/0175134 A1 | 6/2023 | Batzer et al. |
| 2023/0235458 A1 | 7/2023 | Morgan |
| 2024/0318312 A1 | 9/2024 | Batzer et al. |

FOREIGN PATENT DOCUMENTS

| | | |
|---|---|---|
| CN | 101405433 A | 4/2009 |
| CN | 101423936 A | 5/2009 |
| CN | 101423937 A | 5/2009 |
| CN | 101755325 A | 6/2010 |
| CN | 102424956 A | 4/2012 |
| CN | 101755325 B | 7/2012 |
| CN | 102541102 A | 7/2012 |
| CN | 103403843 A | 11/2013 |
| CN | 103521956 A | 1/2014 |
| CN | 103890911 A | 6/2014 |
| CN | 103993293 A | 8/2014 |
| CN | 104278254 A | 1/2015 |
| CN | 104282530 A | 1/2015 |
| CN | 104342632 A | 2/2015 |
| CN | 105185682 A | 12/2015 |
| CN | 106191814 B | 10/2018 |
| CN | 109477207 A | 3/2019 |
| DE | 202004021341 U1 | 11/2007 |
| DE | 202004021342 U1 | 11/2007 |
| EP | 0709875 A1 | 5/1996 |
| EP | 0852392 A2 | 7/1998 |
| EP | 1496138 A1 | 1/2005 |
| EP | 1961837 A1 | 8/2008 |
| EP | 2187104 A1 | 5/2010 |
| EP | 2360292 B1 | 3/2012 |
| JP | H05186292 A | 7/1993 |
| JP | H08239775 A | 9/1996 |
| JP | 2000144421 A | 5/2000 |
| JP | 2002030445 A | 1/2002 |
| JP | 2002033311 A | 1/2002 |
| JP | 2002518839 A | 6/2002 |
| JP | 2003533878 A | 11/2003 |
| JP | 2005303292 A | 10/2005 |
| JP | 2006261217 A | 9/2006 |
| JP | 2006322074 A | 11/2006 |
| JP | 2006324400 A | 11/2006 |
| JP | 2007142363 A | 6/2007 |
| JP | 2007191792 A | 8/2007 |
| JP | 2007227789 A | 9/2007 |
| JP | 2007227829 A | 9/2007 |
| JP | 2008066413 A | 3/2008 |
| JP | 2008211219 A | 9/2008 |
| JP | 2009088229 A | 4/2009 |
| JP | 2009141343 A | 6/2009 |
| JP | 2010062383 A | 3/2010 |
| JP | 2010084190 A | 4/2010 |
| JP | 2010192513 A | 9/2010 |
| JP | 2010232402 A | 10/2010 |
| JP | 2012500471 A | 1/2012 |
| JP | 2012533890 A | 12/2012 |
| JP | 2013174023 A | 9/2013 |
| JP | 2014057047 A | 3/2014 |
| JP | 2014220231 A | 11/2014 |
| JP | 2016004998 A | 1/2016 |
| JP | 2016531436 A | 10/2016 |
| JP | 2017166012 A | 9/2017 |
| JP | 2018044191 A | 3/2018 |
| KR | 20030048844 A | 6/2003 |
| KR | 20040079559 A | 9/2004 |
| KR | 20040091218 A | 10/2004 |
| KR | 100687373 B1 | 2/2007 |
| KR | 20070118836 A | 12/2007 |
| KR | 100831198 B1 | 5/2008 |
| KR | 20090075649 A | 7/2009 |
| KR | 20110036322 A | 4/2011 |
| KR | 20110104434 A | 9/2011 |
| KR | 20110138730 A | 12/2011 |
| KR | 20130141358 A | 12/2013 |
| KR | 20140000168 A | 1/2014 |
| KR | 20140011364 A | 1/2014 |
| KR | 20140029334 A | 3/2014 |
| KR | 20140084308 A | 7/2014 |
| KR | 20140103080 A | 8/2014 |
| KR | 20140121372 A | 10/2014 |
| KR | 20150056631 A | 5/2015 |
| KR | 20150126789 A | 11/2015 |
| KR | 20160016622 A | 2/2016 |
| KR | 20160133373 A | 11/2016 |
| KR | 102014279 B1 | 8/2019 |
| KR | 20220049926 A | 4/2022 |
| TW | 490705 B | 6/2002 |
| TW | 492045 B | 6/2002 |
| TW | 200710928 A | 3/2007 |
| TW | 200946236 A | 11/2009 |
| TW | 201202464 A | 1/2012 |

(56)        References Cited

FOREIGN PATENT DOCUMENTS

| | | | |
|---|---|---|---|
| TW | 201229300 | A | 7/2012 |
| TW | 201411761 | A | 3/2014 |
| TW | 201421564 | A | 6/2014 |
| TW | 201502310 | A | 1/2015 |
| TW | 201509537 | A | 3/2015 |
| TW | 201704524 | A | 2/2017 |
| TW | 201708602 | A | 3/2017 |
| TW | 201742109 | A | 12/2017 |
| TW | 201828361 | A | 8/2018 |
| TW | 201830460 | A | 8/2018 |
| TW | 202017041 | A | 5/2020 |
| WO | WO-0129282 | A2 | 4/2001 |
| WO | WO-0188962 | A1 | 11/2001 |
| WO | WO-2009055244 | A1 | 4/2009 |
| WO | WO-2011009002 | A2 | 1/2011 |
| WO | WO-2011011532 | A2 | 1/2011 |
| WO | WO-2011044451 | A2 | 4/2011 |
| WO | WO-2012122054 | A2 | 9/2012 |
| WO | WO-2012166362 | A1 | 12/2012 |
| WO | WO-2018210001 | A1 | 11/2018 |
| WO | WO-2021076527 | A1 | 4/2021 |
| WO | WO-2021127287 | A1 | 6/2021 |
| WO | WO-2024059684 | A1 | 3/2024 |

OTHER PUBLICATIONS

Chen, et al., "Advances in Remote Plasma Sources For Cleaning 300 mm and Flat Panel CVD Systems" Semiconductor Magazine, , Aug. 2003, pp. 1-6.
Chinese First Office Action dated Apr. 10, 2018 issued in Application No. CN 201610361563.2.
Chinese First Office Action dated Dec. 9, 2015 issued in Application No. CN 201410052998.X.
Chinese First Office Action dated Jun. 18, 2020 issued in Application No. CN 201811101686.8.
Chinese First Office Action dated Mar. 2, 2016 issued in Application No. CN 201410312720.1.
Chinese Fourth Office Action dated Sep. 13, 2017 issued in Application No. CN 201410052998.X.
Chinese Second Office Action dated Feb. 22, 2021 issued in Application No. CN 201811101686.8.
Chinese Second Office Action dated Jul. 27, 2016 issued in Application No. CN 201410052998.X.
Chinese Third Office Action dated Aug. 2, 2021 issued in Application No. CN 201811101686.8.
Chinese Third Office Action dated Mar. 2, 2017 issued in Application No. CN 201410052998.X.
CN Office Action dated Nov. 25, 2022 in Application No. CN201780077684.7 with English translation.
International Search Report and Written Opinion dated Feb. 2, 2021 in Application No. PCT/US2020/US55430.
International Preliminary Report on Patentability dated Apr. 28, 2022 issued in PCT/US2020/055430.
International Search Report and Written Opinion dated Apr. 9, 2018 issued in Application No. PCT/US2017/066411.
International Search Report and Written Opinion dated dated Apr. 1, 2019 in PCT Application No. PCT/US2018/064524.
Japanese First Office Action dated Apr. 15, 2019 issued in Application No. JP 2018-087939.
Japanese First Office Action dated Feb. 13, 2018 issued in Application No. JP 2014-130967.
Japanese First Office Action dated Nov. 7, 2017 issued in Application No. JP 2014-021856.
JP Office Action dated Dec. 21, 2021, in Application No. JP2019-531737 with English translation.
Korean Decision for Grant of Patent dated Jul. 29, 2020 issued in Application No. KR 10-2013-016139.
Korean First Office Action dated Aug. 28, 2019 issued in Application No. KR 10-2013-0071554.

Korean First Office Action dated Mar. 10, 2020 issued in Application No. KR 10-2013-0161939.
Korean First Office Action dated Nov. 18, 2020 issued in Application No. KR 10-2020-0142328.
KR Office Action dated Feb. 15, 2022, in Application No. KR10-2019-7018989 with English Translation.
KR Office Action dated Sep. 22, 2022, in Application No. KR10-2022-7016307 with English translation.
Oviroh, Peter Ozaveshe, et al., "New development of atomic layer deposition: processes, methods and applications" Science and Technology of Advanced Materials (2019) vol. 20, No. 1, pp. 465-496. https://doi.org/10.1080/14686996.2019.1599694.
Paul, et al., "Anti reflection Coating on PM MA Substrates by Atomic Layer Deposition" Coatings 2020, 10, 64; pp. 1-13. doi: 10.3390/coatings 10010064Cpatomgs.
Singapore Final Examination Report dated Jan. 12, 2016 issued in Application No. SG 201401171-2.
Singapore Search Report and Written Opinion dated Jul. 7, 2015 issued in Application No. 201401171-2.
Taiwan Examination and Search Report dated Apr. 11, 2017 issued in Application No. TW102147584.
Taiwan Examination and Search Report dated May 12, 2017 issued in Application No. TW103104956.
Taiwan Examination and Search Report dated Oct. 13, 2016 issued in Application No. TW102122169.
Taiwan First Office Action dated Jul. 3, 2018 issued in Application No. TW 107110096.
Taiwanese First Decision of Refusal dated Nov. 20, 2017 issued in Application No. TW 102147584.
Taiwanese First Office Action dated Aug. 7, 2019 issued in Application No. TW 105116200.
U.S Advisory Action dated Oct. 2, 2019 in U.S. Appl. No. 15/378,854.
US Advisory Action dated Dec. 6, 2018 issued in U.S. Appl. No. 13/934,620.
U.S. Final office Action dated Jul. 15, 2019 in U.S. Appl. No. 15/378,854.
US Final Office Action dated Jun. 22, 2017 issued in U.S. Appl. No. 13/934,620.
US Final Office Action dated May 18, 2016 issued in U.S. Appl. No. 13/842,054.
U.S. Final office Action dated Oct. 31, 2019 in U.S. Appl. No. 15/378,854.
US Final Office Action dated Sep. 13, 2018 issued in U.S. Appl. No. 13/934,620.
US Final Office Action dated Sep. 16, 2016 issued in U.S. Appl. No. 13/934,597.
U.S. Non-Final office Action dated Mar. 5, 2019 in U.S. Appl. No. 15/378,854.
U.S. Notice of Allowance dated Nov. 20, 2019 in U.S. Appl. No. 15/378,854.
US Notice of Allowance dated Apr. 14, 2017 issued in U.S. Appl. No. 13/934,597.
U.S. Notice of Allowance dated Apr. 15, 2021, in U.S. Appl. No. 16/820,003.
US Notice of Allowance dated Feb. 11, 2019 issued in U.S. Appl. No. 13/842,054.
US Notice of Allowance dated Jan. 10, 2017 issued in U.S. Appl. No. 13/934,597.
US Notice of Allowance dated Jan. 15, 2016 issued in U.S. Appl. No. 13/531,254.
US Notice of Allowance dated Jul. 30, 2019 issued in U.S. Appl. No. 16/035,491.
US Notice of allowance dated Mar. 22, 2019 issued in U.S. Appl. No. 16/035,491.
US Notice of Allowance dated Mar. 3, 2021 issued in U.S. Appl. No. 16/434,043.
US Notice of Allowance dated Mar. 8, 2018, issued in U.S. Appl. No. 15/163,594.
US Notice of Allowance dated Mar. 8, 2018 issued in U.S. Appl. No. 13/934,620.
U.S. Notice of Allowance dated May 12, 2016 issued in U.S. Appl. No. 13/531,254.

(56)           References Cited

OTHER PUBLICATIONS

US Notice of Allowance dated May 30, 2018 issued in U.S. Appl. No. 13/842,054.
U.S. Notice of Allowance dated Nov. 3, 2022 in U.S. Appl. No. 17/401,261.
US Office Action dated Apr. 12, 2017 issued in U.S. Appl. No. 13/842,054.
US Office Action dated Apr. 7, 2016 issued in U.S. Appl. No. 13/934,597.
US Office Action dated Dec. 3, 2015 issued in U.S. Appl. No. 13/842,054.
US Office Action dated Mar. 13, 2015 issued in U.S. Appl. No. 13/531,254.
US Office Action dated Nov. 20, 2017 issued in U.S. Appl. No. 13/934,620.
US Office Action dated Nov. 28, 2018, issued in U.S. Appl. No. 16/035,491.
US Office Action dated Oct. 12, 2016 issued in U.S. Appl. No. 13/934,620.
US Office Action dated Oct. 20, 2017 issued in U.S. Appl. No. 13/842,054.
US Office Action dated Sep. 17, 2015 issued in U.S. Appl. No. 13/531,254.
US Office Action dated Sep. 8, 2016 issued in U.S. Appl. No. 13/842,054.
U.S. Restriction Requirement dated Dec. 11, 2018 in U.S. Appl. No. 15/378,854.
CN Office Action dated Aug. 29, 2024 in CN Application No. 202080072107 with English translation.
EP Extended European Search report dated Nov. 13, 2023 in EP Application No. 20875841.7.
International Preliminary Report on Patentability dated Feb. 2, 2023 in PCT Application No. PCT/US2021/042839.
International Search Report and Written Opinion dated Jan. 2, 2024 in PCT Application No. PCT/US2023/074154.
International Search Report and Written Opinion dated Nov. 1, 2024 in PCT Application No. PCT/US2024/037723.
International Search Report and Written Opinion dated Nov. 11, 2021, in PCT Application No. PCT/US2021/042839.
JP Office Action dated Jul. 2, 2024 in JP Application No. 2022-521073, with English Translation.
JP Office Action dated Nov. 21, 2023 in JP Application No. 2022-167262, with English Translation.
KR Notice of Allowance dated Nov. 27, 2024 in KR Application No. 10-2023- 0033201, with English Translation.
KR Office Action dated Apr. 25, 2024 in KR Application No. 10-2022-7040495 with English translation.
KR Office Action dated Feb. 8, 2023 in Application No. KR10-2022-7040495 with English translation.
KR Office Action dated Feb. 28, 2024 in KR Application No. 10-2023-0033201 with English translation.
KR Office Action dated Oct. 13, 2023, in Application No. KR10-2022-7040495 with English translation.
Manfredi, D., et al., "From Powders to Dense Metal Parts: Characterization of a Commercial AlSiMg Alloy Processed through Direct Metal Laser Sintering", Materials 2013, vol. 6, pp. 856-869.
TW Office Action dated Jul. 8, 2024 in TW Application No. 109135303, with English Translation.
U.S. Non-Final Office Action dated Sep. 8, 2023, in U.S. Appl. No. 18/163,828.
U.S. Notice of Allowance dated Feb. 2, 2024 in U.S. Appl. No. 18/163,828.
U.S. Notice of Allowance dated Jan. 29, 2024 in U.S. Appl. No. 18/163,828.
U.S. Notice of Allowance dated May 3, 2024 in U.S. Appl. No. 18/163,828.
International Preliminary Report on Patentability and Written Opinion dated Mar. 27, 2025 in PCT Application No. PCT/US2023/074154.
International Search Report and Written Opinion dated Feb. 28, 2025 in PCT Application No. PCT/US2024/055638.
JP Office Action dated Feb. 12, 2025 in JP Application No. 2022-581340, with English Translation.
TW Office Action and Search Report dated Mar. 14, 2025 in TW Application No. 110127108, with English Translation.
U.S. Notice of Allowance dated Feb. 3, 2025 in U.S. Appl. No. 18/679,771.
U.S. Appl. No. 19/111,319, inventors Huang Z et al., filed Mar. 13, 2025.
TW Office Action and Search Report dated Nov. 6, 2025 in TW Application No. 114111942, with English Translation.
US Non-Final Office Action dated Jul. 15, 2025 in U.S. Appl. No. 18/002,616.

* cited by examiner

DUAL PLENUM FRACTAL SHOWERHEAD

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Semiconductor manufacturing tools frequently include "showerheads" which are used to dispense semiconductor processing gases in a distributed manner over a semiconductor wafer being processed. Such showerheads typically feature a large, open plenum space, e.g., a cylindrical volume sized at least as large in diameter as the wafer diameter being processed, within the showerhead that is then fluidically connected with a plurality of gas distribution ports on the underside of the showerhead. In some such tools, the showerheads may be configured to be able to distribute two different types of processing gas across a wafer being processed.

New dual-gas showerhead designs for use in semiconductor processing tools are disclosed herein.

SUMMARY

Details of one or more implementations of the subject matter described in this specification are set forth in the accompanying drawings and the description below. Other features, aspects, and advantages will become apparent from the description, the drawings, and the claims.

In some implementations, a semiconductor processing apparatus is provided that includes a showerhead. The showerhead may include a body, a first plenum inlet, a second plenum inlet, a plurality of first gas distribution holes, and a plurality of second gas distribution holes. The body may also include a plurality of layers, the plurality of layers including a proper subset of two or more fractal layers, each fractal layer including a set of first radially symmetric gas distribution features and a set of second radially symmetric gas distribution features. Each first radially symmetric gas distribution feature may include a first hub plenum, a plurality of first spoke passages that are fluidically connected to the first hub plenum and that radiate outward from the first hub plenum, and a plurality of first riser ports, each first riser port located at a distal end of one of the first spoke passages. Each second radially symmetric gas distribution feature may include a second hub plenum, a plurality of second spoke passages that are fluidically connected to the second hub plenum and that radiate outward from the second hub plenum, and a plurality of second riser ports, each second riser port located at a distal end of one of the second spoke passages. For each fractal layer of the fractal layers, each first radially symmetric gas distribution feature of that fractal layer may be positioned such that the corresponding first hub plenum is positioned beneath a first riser port of the immediately upstream layer, and each second radially symmetric gas distribution feature of that fractal layer may be positioned such that the corresponding second hub plenum is positioned beneath a second riser port of the immediately upstream layer.

In some implementations, one of the fractal layers may also include a set of first partial radially symmetric gas distribution features, each first partial radially symmetric gas distribution feature having a first hub plenum with a lesser number of first spoke passages fluidically connected therewith compared with any of the first radially symmetric gas distribution features of that fractal layer.

In some further such implementations, the body further may further include a feed layer immediately upstream of the fractal layer with the set of first partial radially symmetric gas distribution features. In such implementations, the feed layer may include a plurality of first feed plenums, each first feed plenum having a one or more of first feed spoke passages fluidically connected therewith, each first feed spoke passage having a first feed riser port at a distal end thereof, and each first feed riser port positioned above, and fluidically connected with, a corresponding one of the first hub plenums in the fractal layer immediately downstream from the feed layer. In such implementations, the first feed spoke passages that have first feed riser ports that are fluidically connected with first hub plenums of the first radially symmetric gas distribution features in the fractal layer immediately downstream of the feed layer may each have a first length, and the first feed spoke passages that have first feed riser ports that are fluidically connected with first hub plenums of the first partial radially symmetric gas distribution features in the fractal layer immediately downstream of the feed layer may each have lengths longer than the first length.

In some further or alternative such implementations, the fractal layer with the set of first partial radially symmetric gas distribution features may also include a set of second partial radially symmetric gas distribution features, each second partial radially symmetric gas distribution feature having a second hub plenum with a lesser number of second spoke passages compared with any of the second radially symmetric gas distribution features of that fractal layer.

In some such implementations, the body may further include a feed layer immediately upstream of the fractal layer with the set of first partial radially symmetric gas distribution features and the set of second partial radially symmetric gas distribution features. In such implementations, the feed layer may include a plurality of first feed plenums and a plurality of second feed plenums, each first feed plenum having one or more first feed spoke passages fluidically connected therewith and each second feed plenum having one or more second feed spoke passages fluidically connected therewith, each first feed spoke passage having a first feed riser port at a distal end thereof and each second feed spoke passage having a second feed riser port at a distal end thereof, each first feed riser port positioned above, and fluidically connected with, a corresponding one of the first hub plenums in the fractal layer immediately downstream from the feed layer, and each second feed riser port positioned above, and fluidically connected with, a corresponding one of the second hub plenums in the fractal layer immediately downstream from the feed layer. In such implementations, the first feed spoke passages that have first feed riser ports that are fluidically connected with first hub plenums of the first radially symmetric gas distribution features in the fractal layer immediately downstream of the feed layer may each have a first length, the first feed spoke passages that have first feed riser ports that are fluidically connected with first hub plenums of the first partial radially symmetric gas distribution features in the fractal layer immediately downstream of the feed layer may each have lengths longer than the first length, the second feed spoke passages that have second feed riser ports that are fluidically connected with second hub plenums of the second radially symmetric gas distribution features in the fractal layer immediately downstream of the feed layer may each have a second length, and the second feed spoke passages that have second feed riser ports that are fluidically connected with second hub plenums of the second partial radially symmetric gas distribution features in the fractal layer immediately downstream of the feed layer may each have lengths longer than the second length.

In some implementations, the first radially symmetric gas distribution features of the fractal layers may each include four first spoke passages and the second radially symmetric gas distribution features of the fractal layers each include four second spoke passages.

In some further such implementations, the first spoke passages and the second spoke passages for the first radially symmetric gas distribution features and the second radially symmetric gas distribution features, respectively, of at least one fractal layer of the fractal layers may be at the same elevation.

In some additional or alternative such implementations, the first spoke passages may each be aligned with one of two orthogonal first passage axes, the second spoke passages may each be aligned with one of two orthogonal second passage axes, and the first passage axes may be 45° out-of-phase with (or at a 45° angle to) the second passage axes.

In some further such implementations, for each of the fractal layers with an immediately upstream fractal layer, the first radially symmetric gas distribution features of that fractal layer may each have center-to-center spacings between the corresponding first riser ports thereof that are approximately 50% of the corresponding center-to-center spacings between first riser ports in the first radially symmetric gas distribution features of the immediately upstream fractal layer.

In some further or alternative such implementations, for each of the fractal layers with an immediately upstream fractal layer, the second radially symmetric gas distribution features of that fractal layer may each have center-to-center spacings between the corresponding second riser ports thereof that are approximately 50% of the corresponding center-to-center spacings between second riser ports in the second radially symmetric gas distribution features of the immediately upstream fractal layer.

In some implementations, there may be at least three fractal layers.

In some implementations, the body may be made from a ceramic material.

In some further such implementations, the body may be made from multiple discrete layers of ceramic material that are fused together.

In some further or alternative such implementations, the body may be a 3D-printed structure.

In some implementations, the apparatus may further include a processing chamber and a pedestal. In such implementations, the pedestal may be positioned within the processing chamber, and the showerhead may be positioned within the processing chamber above the pedestal.

BRIEF DESCRIPTION OF THE DRAWINGS

The various implementations disclosed herein are illustrated by way of example, and not by way of limitation, in the figures of the accompanying drawings, in which like reference numerals refer to similar elements.

Figures 10, 11:
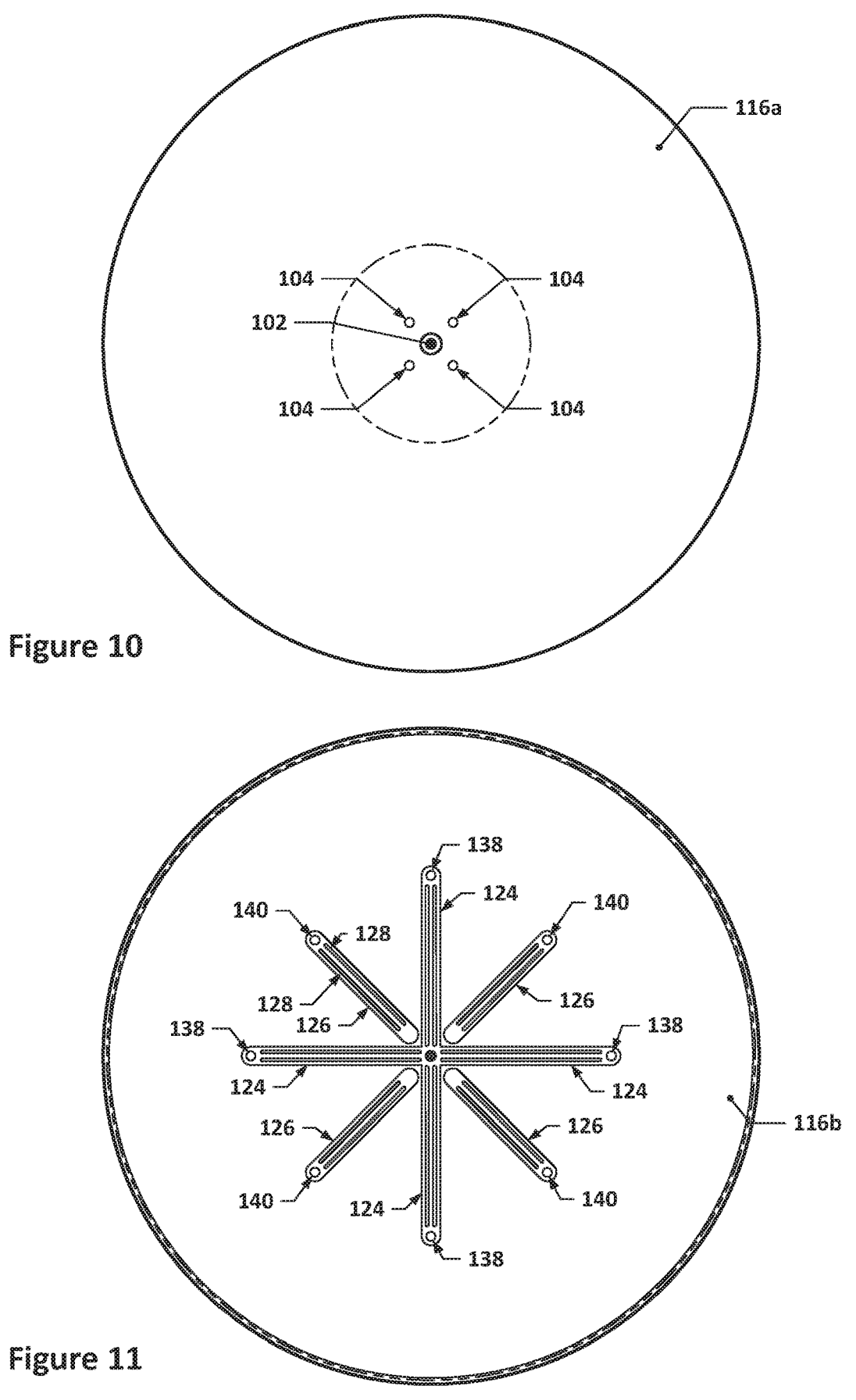

FIGS. 10 through 15 show plan views of various layers of the example dual-plenum fractal showerhead of FIG. 1.

FIGS. 1-18 are drawn to-scale within each Figure, although the scale may vary from Figure to Figure. The Figures depict only an example of the concepts discussed herein, and it will be readily appreciated that the concepts discussed herein may be implemented in a large number of alternate implementations, all of which are considered to be within the scope of this disclosure.

DETAILED DESCRIPTION

Figures 1, 2:
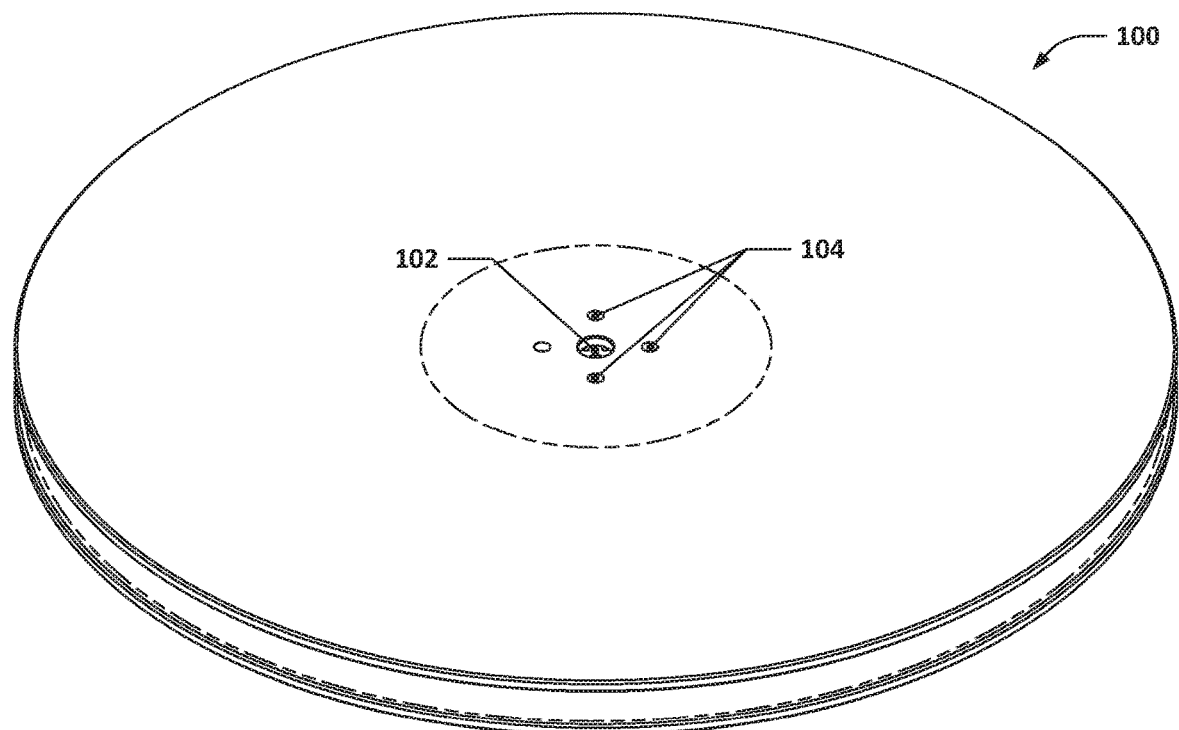
FIG. 1 depicts an isometric view of an example dual-plenum fractal showerhead.
FIG. 2 depicts a reverse isometric view of the example dual-plenum fractal showerhead of FIG. 1.

Importantly, the concepts discussed herein are not limited to any single aspect or implementation discussed herein, nor to any combinations and/or permutations of such aspects and/or implementations. Moreover, each of the aspects of the present invention, and/or implementations thereof, may be employed alone or in combination with one or more of the other aspects and/or implementations thereof. For the sake of brevity, many of those permutations and combinations will not be discussed and/or illustrated separately herein.

The dual-plenum fractal showerheads discussed herein may be configured to evenly distribute processing gases to a processing volume located above a semiconductor wafer in a semiconductor processing chamber. Such dual-plenum fractal (DPF) showerheads may offer various benefits as compared with more traditional dual-plenum showerheads. For example, due to the absence of large plenums, e.g., plenums that are generally circular in shape and span across the entire area in which gas distribution holes for the showerhead are located, the amount of process gas that must be introduced into the showerhead in order to deliver that process gas through the gas distribution ports of the showerhead may be considerably reduced in the DPF showerhead designs discussed herein as compared with conventional, open plenum volume showerheads. Another benefit is that the fractal nature of the various flow paths in DPF showerheads allows the flow paths to each gas distribution port for a given plenum of a DPF showerhead to have equal, or at least very similar, flow resistance, thus decreasing or eliminating the variability of the time it takes for gas introduced into that plenum via a gas inlet to reach any given gas distribution port of that plenum. For example, the gas flowing through a fractal showerhead plenum may generally, regardless of to which gas distribution port it ultimately flows, experience generally the same fluid flow path characteristics, e.g., the gas may flow through successive gas flow passages that have the same progression of passage segments having similar lengths, cross-sectional shapes and areas, after the gas reaches the fractal layers of such a showerhead (such layers are described in detail later below). This may help promote more uniform wafer processing, as the entire wafer surface will generally be simultaneously exposed to such a process gas, as opposed to, for example, a showerhead where process gas flows out of the center of the showerhead for some time before flowing out of the periphery of the showerhead. Another benefit of the DPF showerheads discussed herein is that they may be manufactured from a variety of materials, including metals (stainless steel, aluminum, etc.) and ceramics (alumina, silicon oxide, etc.).

Generally speaking, DPF showerhead such as those discussed herein may have two patterns of gas distribution holes on the underside of the showerhead, one for each plenum. In the DPF example discussed below, the two patterns are generally square patterns that are 45° out of phase with each other (and which omit several instances of gas distribution holes at the corners of each square pattern, e.g., a 4×4 sub-pattern of gas distribution holes are omitted at each corner of each pattern). The 45° out-of-phase arrangement may be carried forth into the interior layout of the various passages that define, in part, the two gas distribution plenums within the example DPF showerhead. This allows for a very dense packaging of gas flow passages within the DPF showerhead and provides for reduced gas distribution hole pitch, thereby allowing for a more finely granular distribution of process gas across a semiconductor wafer.

DPF showerheads may be used in both asynchronous, i.e., the process gases are alternately flowed through each plenum at different times, and synchronous, i.e., the process gases are flowed through both plenums simultaneously, contexts. In some additional instances, a DPF showerhead may be used in a hybrid approach in which one plenum has a process gas flowed through it continually while the other plenum has two or more different gases flowed through it in an alternating or cyclic manner. In the former case, which may, for example, be applicable to atomic layer deposition or other alternating process gas application processes, the reduced volume of a DPF showerhead as compared with traditional showerheads may allow for a reduced lag time before the desired quantity of process gas is delivered to the wafer, thereby reducing the overall duration of each gas dose cycle (and thus decreasing processing time/increasing throughput). In the latter case, which may, for example, be applicable to processing operations in which two process gases are simultaneously flowed into the processing space above a semiconductor wafer such that they react to achieve a desirable processing effect on the wafer, the increased simultaneity performance of a DPF showerhead may reduce the chance of one reactant being present in the wafer processing space without the other also being present. In particular, DPF showerheads as discussed herein may be useful in processes such as those discussed in U.S. Patent Application Nos. 62/767,198, filed Nov. 14, 2018, and titled "METHODS FOR MAKING HARD MASKS USEFUL IN NEXT-GENERATION LITHOGRAPHY," and 62/868,710, filed Jun. 28, 2019, and titled "EUV PHOTORESIST WITH MULTIPLE EUV-ABSORBING ELEMENTS AND VERTICAL COMPOSITION GRADIENT," both of which are hereby incorporated herein by reference in their entireties.

Figures 3, 4:
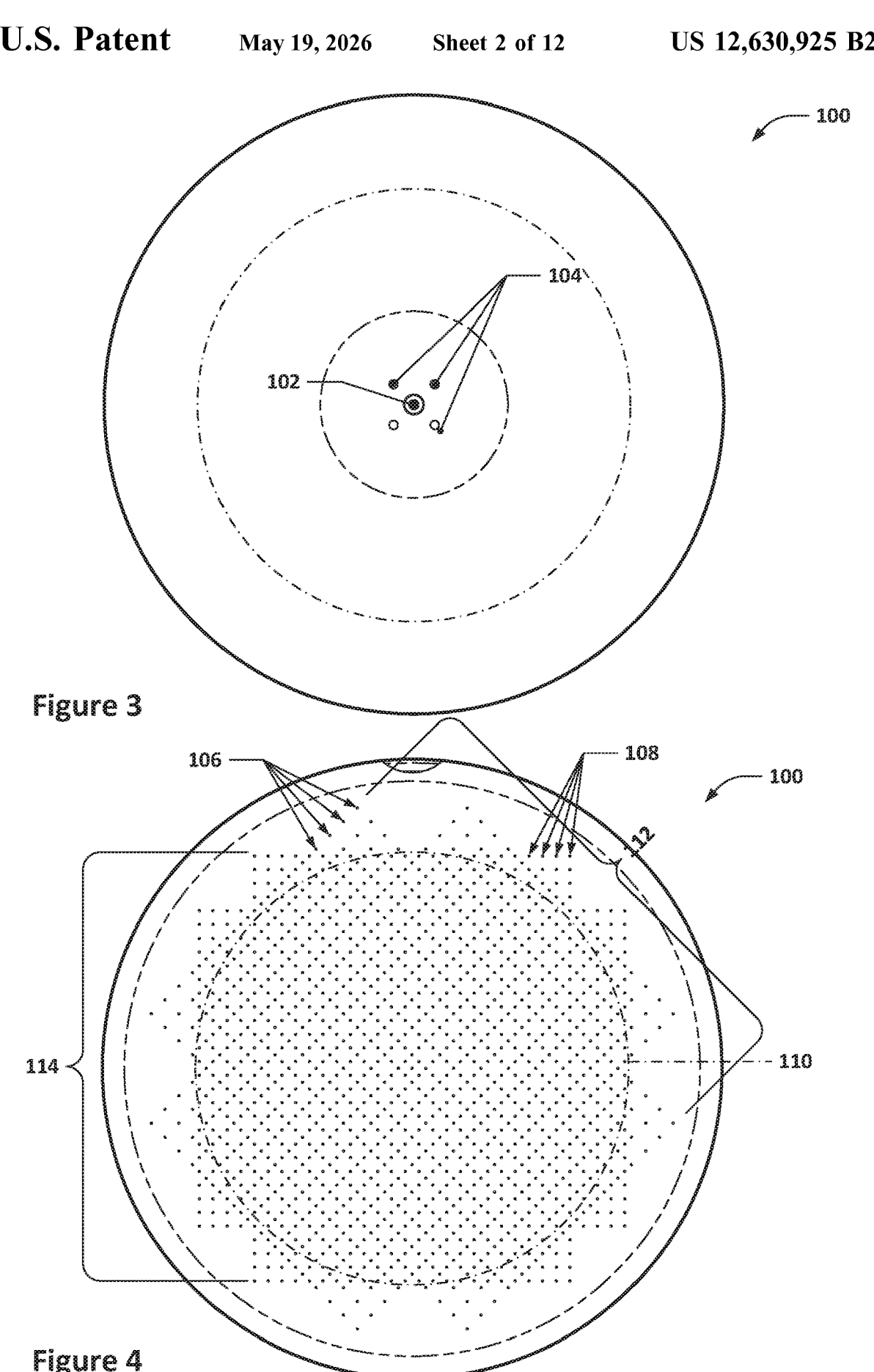
FIGS. 3 and 4 depict, respectively, top and bottom views of the example dual-plenum fractal showerhead of FIG. 1.

FIG. 1 depicts an isometric view of an example dual-plenum fractal (DPF) showerhead; FIG. 2 depicts a reverse isometric view of the example DPF showerhead of FIG. 1. FIGS. 3 and 4 depict top and bottom plan views of the same example DPF showerhead of FIG. 1.

In outward appearance, the DPF showerhead 100 of FIG. 1 is little different from many other dual-plenum showerheads—it is generally circular in shape, has a plurality of gas inlets, e.g., a first plenum inlet 102 and, in this example, multiple (four) second plenum inlets 104, on the top surface, and two hole patterns, e.g., a first hole pattern 112 and a second hole pattern 114, of gas distribution holes, e.g., first gas distribution holes 106 and second gas distribution holes 108, respectively, on the bottom surface thereof. It will be noted that the first hole pattern 112 and the second hole pattern 114 are both generally in the form of rectangular (or, more accurately, square) arrays, although the two rectangular arrays are oriented to be 45° out of phase with each other. There is also one additional first gas distribution hole 106 that is not part of the rectangular first hole pattern 112—this additional first gas distribution hole 106 is located in the center of the DPF showerhead 100. In most traditional showerheads, the hole pattern(s) for the gas distribution holes are typically constrained to have a generally circular outer extent, i.e., the hole pattern(s) extend outwards to a circular boundary, and all of the gas distribution holes for a given plenum lie within that circular boundary and are generally evenly distributed within that boundary. In the example DPF showerhead, however, this is not the case (although it could be, as discussed further below). As can be seen, the first gas distribution holes 106 and second gas distribution holes 108 are generally evenly distributed within a circular wafer overlap area 110 (in this case, the wafer overlap area 110 is sized to be the same size as a semiconductor processing wafer that would normally be positioned beneath the DPF showerhead during processing, e.g., 300 mm in diameter (although such even hole distribution may, for example, be maintained across an even larger diameter circular area in some implementations, e.g., to provide uniform gas distribution up to and beyond the wafer perimeter during processing). However, there are portions of both the first hole pattern 112 and the second hole pattern 114 that extend beyond the wafer overlap area 110. The first gas distribution holes 106 and the second gas distribution holes 108 that lie outside of the wafer overlap area 110 are no longer evenly distributed with respect to one another. As will be seen in later discussion, in the example DPF showerhead, the gas distribution ports that lie outside of the wafer overlap area 110 are included to allow for various gas distribution features for each plenum in various layers within the DPF showerhead to be of identical design for each layer; it will be understood that, with appropriate modification, e.g., through the use of variably designed gas distribution features near the periphery of the DPF showerhead 100 in such layers, a DPF showerhead may be provided that reduces or eliminates the gas distribution ports located outside of the wafer overlap area 110. Such alternate implementations are considered to be within the scope of this disclosure as well.

It will be observed that in the example implementation, the array spacings $d_1$ and $d_2$, respectively, for the first hole pattern 112 and the second hole pattern 114, are related in that $$d_1 = \sqrt{2 \cdot d_2^2},$$

resulting in $d_1$ being about 40% greater than $d_2$; other implementations may feature different hole spacing relationships. It will also be evident that, as a result of such spacing, in the regions where both hole patterns generally overlap, e.g., within the wafer overlap area 110, there are twice as many of the second gas distribution holes 108 as there are first gas distribution holes 106. For example, if one takes an arbitrary smallest square region completely within the wafer overlap area 110 that includes at least four first gas distribution hole 106 locations and at least four second gas distribution hole 108 locations (which includes at least one full pattern repetition along each axis for each pattern), there will be 4 instances of half of a second gas distribution hole 108 and four instances of a quarter of a first gas distribution hole 106 located within that square region, thus a 2:1 ratio of second gas distribution holes 108 to first gas distribution holes 106 (other implementations may see a different ratio, e.g., 1:1). In the present example DPF showerhead, the first gas distribution holes 106 and the second gas distribution holes 108 have the same diameter, resulting in generally twice as much process gas flowing through the second gas distribution holes 108 as through the first gas distribution holes 106 when process gases are introduced into the respective inlets and kept at the same inlet pressure (assuming that both plenums have sub-sonic flow conditions; in actual practice in some implementations, control systems with mass flow controllers may be used to ensure that the same mass flow rate of gas is delivered through each plenum, which may result in each plenum experiencing different inlet pressures and different exit velocities from the corresponding gas distribution ports thereof). However, in other implementations, the diameters of one or both of the first gas distribution holes 106 and the second gas distribution holes 108 may be varied, such that the first gas distribution holes 106 are larger or smaller than the second gas distribution holes in order to adjust the potential flow rates of the gases flowing through both sets of gas distribution holes.

Figure 5:
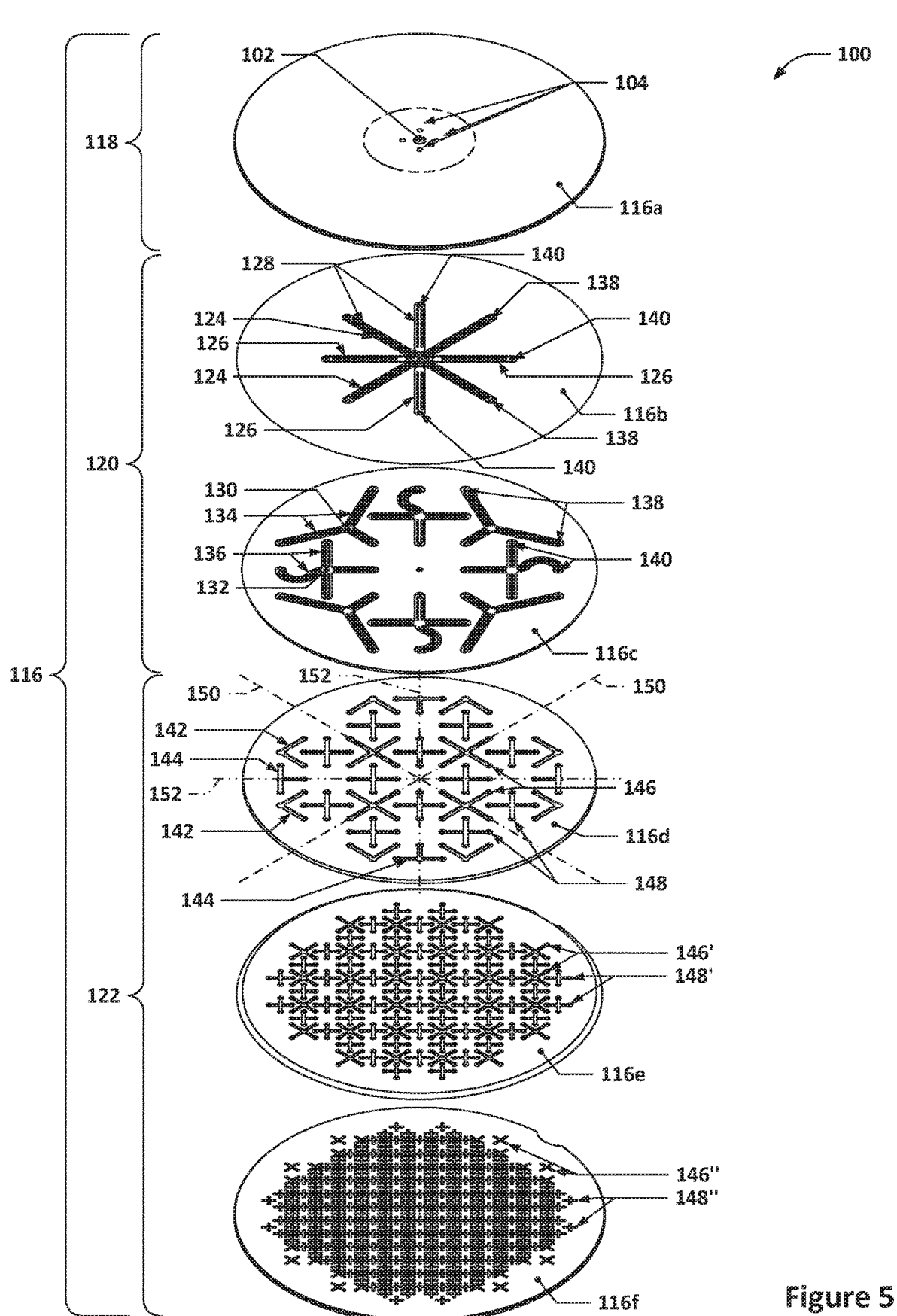
FIG. 5 depicts an isometric exploded view of the example dual-plenum fractal showerhead of FIG. 1.

FIG. 5 depicts an isometric exploded view of the example DPF showerhead of FIG. 1. As can be seen in this exploded view, the DPF showerhead 100 may be divided up into a plurality of different layers 116, with each layer having different gas distribution features. It will be appreciated that such a DPF showerhead 100 may be created, for example, by machining or otherwise forming each layer as a discrete component and then bonding or fusing the various layers together into a laminated stack to provide the DPF showerhead. However, in other implementations, other techniques may be used or produce an equivalent structure, e.g., additive manufacturing may be used to "3D print" the DPF showerhead structure, e.g., from metal, ceramic, or other material.

In this discussion, reference to a layer that is "upstream" from a particular layer will be understood to be one that is closer to "top" of the DPF showerhead 100, e.g., closer to the first plenum inlet 102 or the second plenum inlet(s) 104; reference to a layer that is "downstream" from a particular layer will be understood to be one that is closer to "bottom" of the DPF showerhead 100, e.g., closer to the first gas distribution holes 106 or the second gas distribution holes 108. Reference to a layer that is "immediately upstream" of a particular layer refers to the closest upstream layer to that layer; reference to a layer that is "immediately downstream" of that particular layer similarly refers to the closest downstream layer to that layer. It will also be understood that while a person may arbitrarily section any given showerhead into layers in any manner they see fit, the use of "layer" in this application is to be understood to refer to layers such as are depicted in FIG. 5, e.g., where each layer has riser holes (or gas distribution holes) in one side and gas flow passages/plenums in the other side and where each riser port/gas distribution hole in the layer terminates at one of the gas flow passages (the exception to this may be the inlet layer, which only has riser holes through it, in the form of the first plenum inlet 102 and the second plenum inlet(s) 104).

The various layers 116 may, for example, include an inlet layer 118 (including layer 116*a*), feed layers 120 (including layers 116*b* and 116*c*, for example), and fractal layers 122 (including layers 116*d*, 116*e*, and 116*f*, for example). The inlet layer 118 may include, for example, through-holes or other features through which process gases may be introduced into the plenums of the DPF showerhead 100, such as the first plenum inlet 102 and the second plenum inlets 104.

The feed layers 120 may include, for example, a layer 116*b* that includes first feed passages 124 and second feed passages 126, which may each fluidically connect, within the layer 116*b*, the first plenum inlet 102 or one of the second plenum inlets 104, respectively, with a corresponding first feed riser port 138 or second feed riser port 140, respectively. The first feed riser ports 138 and the second feed riser ports 140 in the layer 116*b* may pass through the bottom of the layer 116*b* and may each fluidically connect one of the first feed passages 124 or second feed passages 126, respectively, with a first feed plenum 130 or second feed plenum 132, respectively, in a layer 116*c*.

The layer 116*c*, which is one of the feed layers 120, may have a plurality of gas distribution features that each generally take the form of a central plenum having a plurality of feed spoke passages extending outward therefrom. For example, the layer 116*c* may have a plurality of first feed plenums 130 (four are shown, but other numbers may be used as well—there will generally be as many as there are first feed riser ports 138 in the immediately upstream layer 116). Similarly, the layer 116*c* may also have a plurality of second feed plenums 132 (four are shown, but other numbers may be used as well—there will generally be as many as there are second feed riser ports 140 in the immediately upstream layer 116).

Each first feed plenum 130 may have a plurality of first feed spoke passages 134 that radiate outward from that first feed plenum 130; each first feed spoke passage 134 may terminate at a corresponding first feed riser port 138 in the layer 116*c* that leads to the immediately downstream layer 116, e.g., layer 116*d*. Similarly, each second feed plenum 132 may have a plurality of second feed spoke passages 136 that radiate outward from that second feed plenum 132; each second feed spoke passage 136 may terminate at a corresponding second feed riser port 140 in the layer 116*c* that leads to the immediately downstream layer 116. Each first feed riser port 138 and second feed riser port 140 in the layer 116*c* may be positioned at a location generally centered over a corresponding plenum feature in the immediately downstream layer.

It will be noted that feed spoke passages radiating out from each feed plenum may not necessarily have equal flow resistances due to variation in the geometry of the feed spoke passages. This is discussed in more detail later.

It will also be noted that the feed passages and the feed spoke passages shown in FIG. 5 also each include two internal support walls 128, which generally extend along the length of such passages from one end of those passages to the other. Such support walls 128 (or other structures that may, for example, be optionally included in some implementations. For example, if the DPF showerhead 100 is made of green-machined ceramic layers that are stacked together and then fired in a kiln to form a single, fused, hardened ceramic part, it may be desirable for wider-width passages to include one or more internal support walls 128 (or other support structures) to provide mechanical support to the layer that forms the "top" of such passages. Other geometries and/or other manufacturing techniques may not require such support walls 128.

Figures 8, 9:
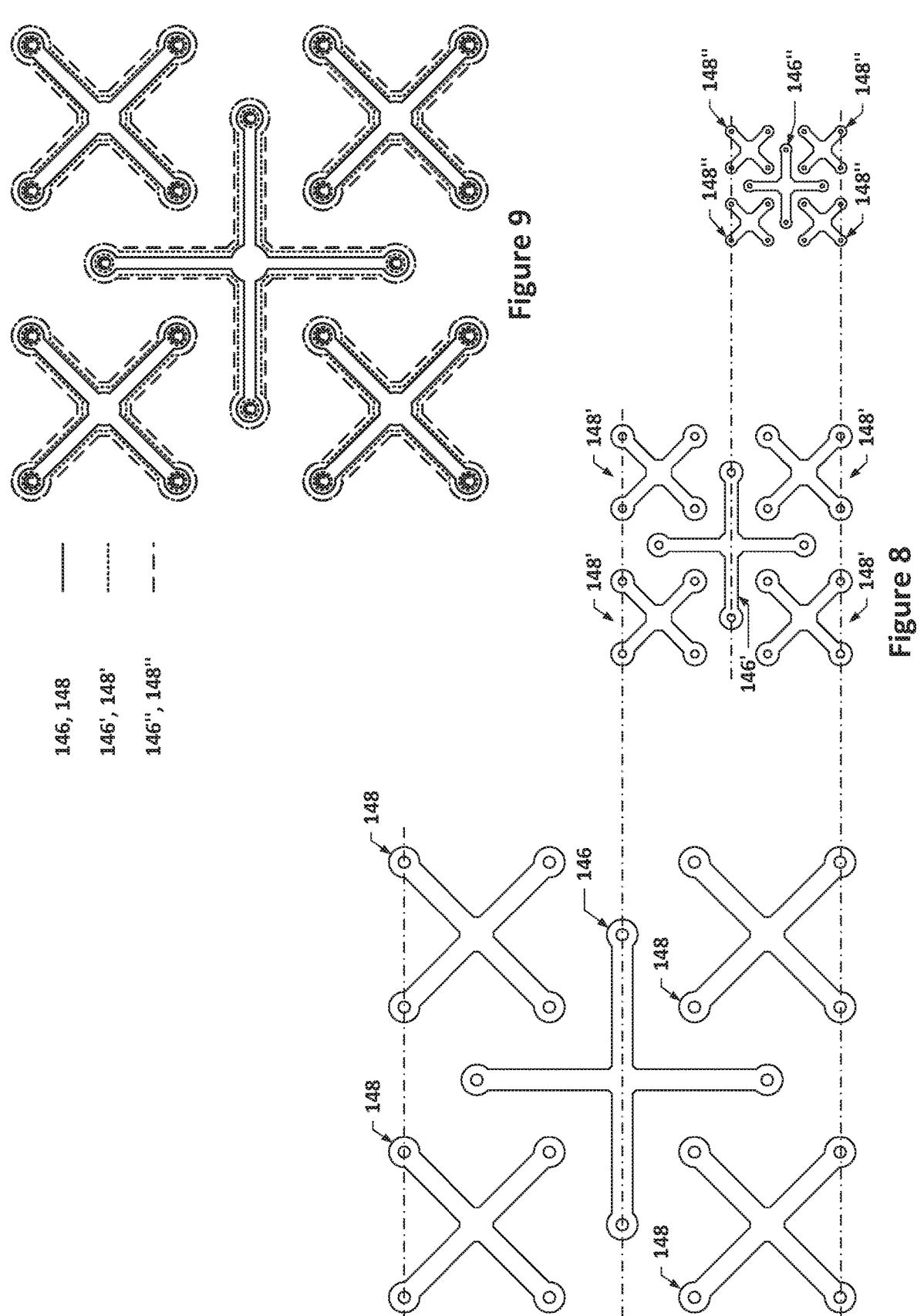
FIG. 8 depicts a size comparison between sets of radially symmetric gas distribution features from each of three different fractal layers.
FIG. 9 provides insight as to relative proportions of gas distribution features from different fractal layers.
Figures 12, 13:
Figures 14, 15:
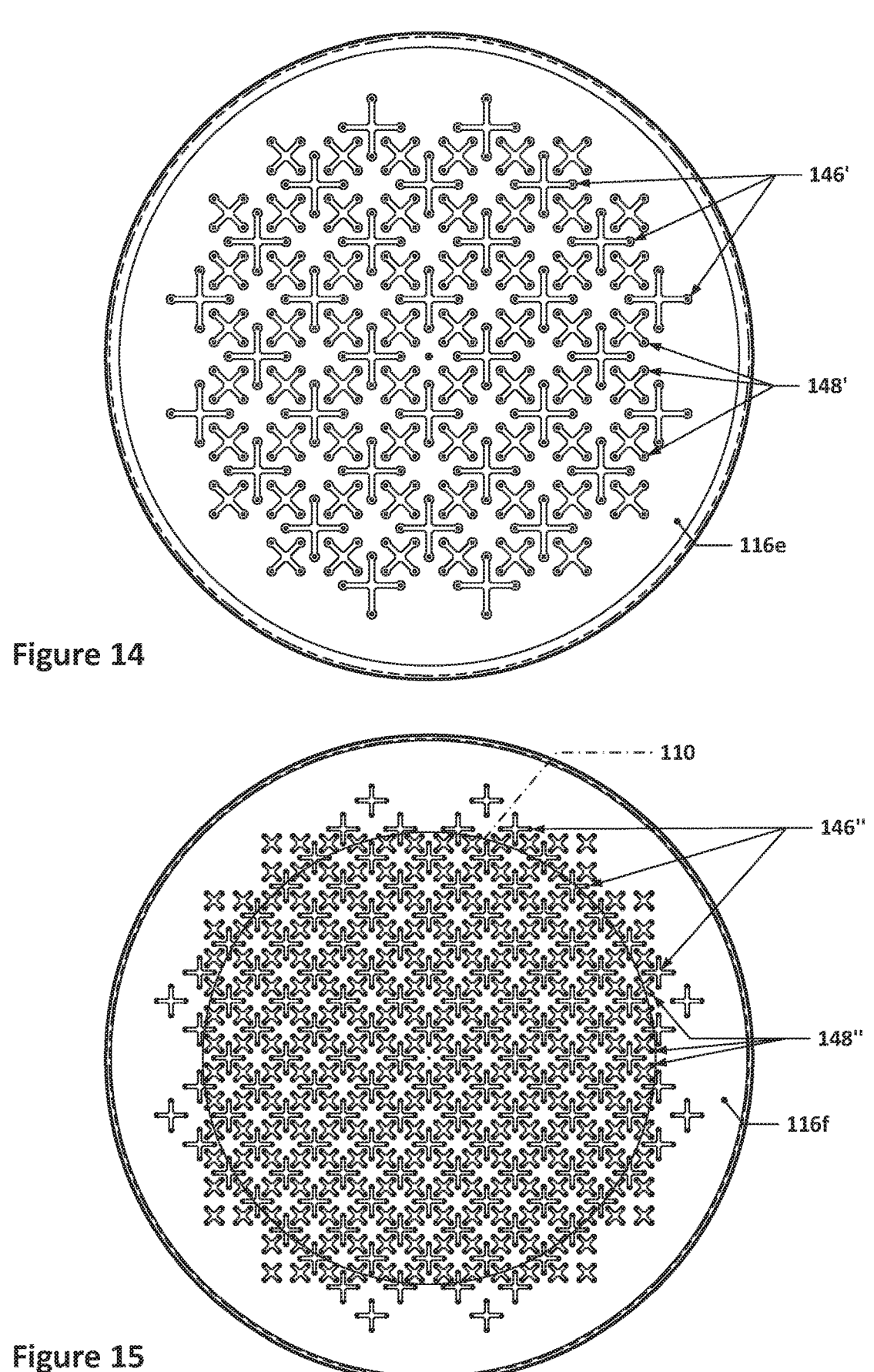

After flowing through the feed layers 120, process gases are then directed into the fractal layers 122. The fractal layers 122 generally each feature identical, repeating radially symmetric gas distribution features (or portions thereof) for each plenum, with the radially symmetric gas distribution features of each layer immediately downstream of a layer being scaled-down versions of the corresponding radially symmetric gas distribution features in that layer. In the present example, each radially symmetric gas distribution feature in a layer is scaled down ~50% in overall size from the corresponding radially symmetric gas distribution feature in the immediately upstream layer, although other implementations may utilize different scaling. FIG. 8 depicts a size comparison between sets of radially symmetric gas distribution features from each of the three fractal layers 122 shown in FIG. 5—each radially symmetric gas distribution feature set is shown to-scale relative to the other radially symmetric gas distribution feature sets shown. As can be seen from the dash-dot-dash lines passing through the centers of selected riser ports of each radially symmetric gas distribution feature set, the center-to-center riser hole spacing in each radially symmetric gas distribution feature set shrinks by 50% in each fractal layer 122 compared with the immediately upstream radially symmetric gas distribution feature set.

This characteristic gives the gas distribution passages for each plenum within a DPF showerhead a "fractal" appearance, thus giving meaning to the name "dual-plenum fractal showerhead." It will be noted that in some implementations, specific sub-features in each radially symmetric gas distribution feature may be scaled up or scaled down from the corresponding feature of a radially symmetric gas distribution feature in the immediately upstream layer. For example, in the example DPF showerhead 100, the center-to-center distance between the riser ports for a given radially symmetric gas distribution feature is 50% of the corresponding center-to-center distance between riser ports for the radially symmetric gas distribution feature immediately upstream from the given radially symmetric gas distribution feature. However, the cross-sectional width of each spoke passage may actually increase relative to that center-to-center spacing in the immediately upstream radially symmetric gas distribution feature. FIG. 9 provides additional insight as to such characteristics. In FIG. 9, three sets of one first radially symmetric gas distribution feature 146 and four adjacent second radially symmetric gas distribution features 148 (one set from each of the three fractal layers 122) have been scaled such that all have the same center-to-center distances between their respective riser holes and then overlaid so that they are centered on one another. As can be seen, the first and second radially symmetric gas distribution features 146' and 148', respectively, from the layer 116e (shown in dotted outline) feature slightly wider (relative to the center-to-center distances between riser holes) spoke passages than the corresponding first and second radially symmetric gas distribution features 146 and 148. Similarly, the first and second radially symmetric gas distribution features 146" and 148", respectively, from the layer 116f (shown in dashed outline) feature slightly wider (relative to the center-to-center distances between riser holes) spoke passages than the corresponding first and second radially symmetric gas distribution features 146' and 148'.

Additionally, it can be seen that the size of the diameters of the first and second riser holes of each radially symmetric gas distribution feature relative to the center-to-center spacing may vary between radially symmetric gas distribution features in fractal layers that are immediately upstream/downstream from one another.

In some implementations, a portion of the radially symmetric gas distribution features for one or more fractal layers 122 may be provided only in "partial form," i.e., with only a portion of the radially symmetric gas distribution features present. For example, the radially symmetric gas distribution features in the example DPF showerhead are +-shaped or x-shaped, each having four spoke passages radiating outward from a hub plenum. A partial radially symmetric gas distribution feature, in this context, may be similarly structured, but missing one or two of the spoke passages.

Figure 6:
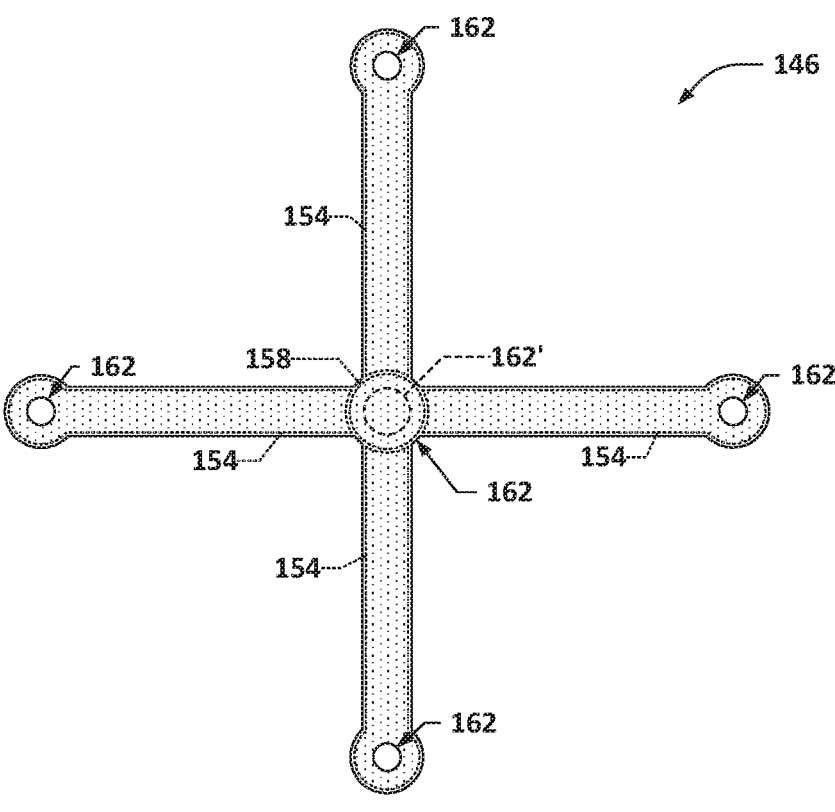
FIG. 6 depicts a detail view of an example first radially symmetric gas distribution feature.
Figure 7:
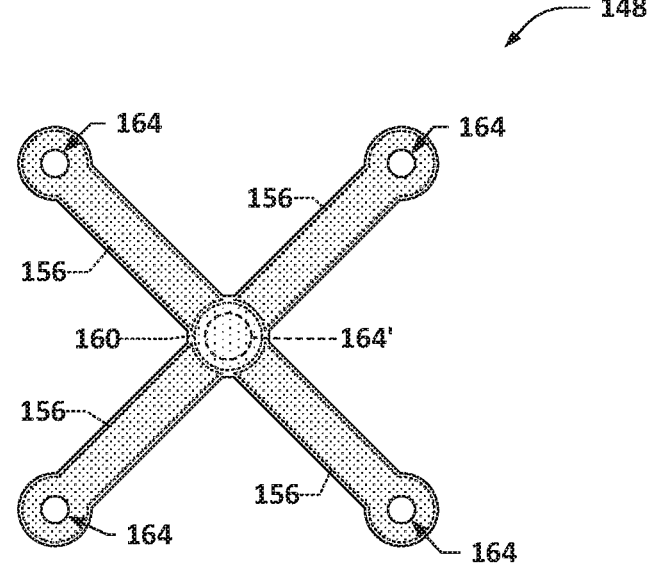
FIG. 7 depicts a detail view of an example first radially symmetric gas distribution feature.

For example, in layer 116d, there are a plurality of first radially symmetric gas distribution features 146 and a plurality of second radially symmetric gas distribution features 148, each of which is +-shaped or x-shaped (the first radially symmetric gas distribution features 146, however, are larger than the second radially symmetric gas distribution features 148, it will be noted—see earlier discussion about the array spacing). The first radially symmetric gas distribution features 146 and the second radially symmetric gas distribution features 148 each have a corresponding hub plenum and a plurality of spoke passages radiating outward therefrom. FIG. 6 depicts an example first radially symmetric gas distribution feature 146, and FIG. 7 depicts an example second radially symmetric gas distribution feature 148; FIGS. 6 and 7 are shown at the same scale. As can be seen, the first radially symmetric gas distribution feature 146 has a first hub plenum 158, which may be positioned directly beneath, and be fluidically connected with, a corresponding first riser port 162' (or, in some instances, first feed riser port 138) from the immediately upstream layer 116. The first hub plenum 158 may have a plurality (in this case, four) of first spoke passages 154 that radiate outward from the first hub plenum 158 in a radially symmetric manner. Each first spoke passage 154 may terminate at a corresponding first riser port 162 (or, in the case of the most downstream layer 116, at a corresponding first gas distribution hole 106).

Similarly, the second radially symmetric gas distribution feature 148 of FIG. 7 has a second hub plenum 160, which may be positioned directly beneath, and be fluidically connected with, a corresponding second riser port 164' (or, in some instances, second feed riser port 140) from the immediately upstream layer 116. The second hub plenum 160 may have a plurality (in this case, four) of second spoke passages 156 that radiate outward from the second hub plenum 160 in a radially symmetric manner. Each second spoke passage 156 may terminate at a corresponding second riser port 164 (or, in the case of the most downstream layer 116, at a corresponding second gas distribution hole 108).

Returning to FIG. 5, it will be noted that the first radially symmetric gas distribution features 146 and the second radially symmetric gas distribution features 148 generally occupy the central region of the layer 116d, but near the periphery of the layer 116d, first partial radially symmetric gas distribution features 142 and second partial radially symmetric gas distribution features 144 are used. The first partial radially symmetric gas distribution features 142 each have only two first spoke passages 154, and the second partial radially symmetric gas distribution features 144 each have only three second spoke passages 156. The remaining fractal layers 122 in this example feature only radially symmetric gas distribution features and do not feature any partial radially symmetric gas distribution features, although other implementations may also include partial radially symmetric gas distribution features in other fractal layers 122 as well.

While the previous Figures clearly convey the structure of the example DPF showerhead 100, FIGS. 10 through 15 are also provided to show plan views of the layers 116*a-f* of the example dual-plenum fractal showerhead of FIG. 1. While these Figures are somewhat redundant of the previous Figures, they may provide additional clarity, and, in particular, may be referenced in the following discussion.

The use of partial radially symmetric gas distribution features may result in flow imbalances in a DPF showerhead such as that shown unless certain mitigating measures are taken. For example, if the same amount of process gas is provided at the same gas flow rate to each hub plenum of a radially symmetric gas distribution feature as for a corresponding partial radially symmetric gas distribution feature, the riser ports for the partial radially symmetric gas distribution feature will each see an increased gas flow rate as compared with the riser ports for the radially symmetric gas distribution feature—this is because there are fewer spoke passages and corresponding riser ports for the partial radially symmetric gas distribution feature as compared with the radially symmetric gas distribution feature. There is therefore less total cross-sectional area for the riser ports for the partial radially symmetric gas distribution feature as compared with the riser ports for the radially symmetric gas distribution feature, resulting in a greater volume of gas being flowed through each riser port of the partial radially symmetric gas distribution feature as compared with through each riser port of the radially symmetric gas distribution feature. This is undesirable, as it will lead to downstream radially symmetric gas distribution features in the subsequent layers 116 that are provided gas from the partial radially symmetric gas distribution feature receiving a disproportionate amount of gas compared to the radially symmetric gas distribution features in those same downstream layers that are provided gas from the radially symmetric gas distribution feature. This, in turn, will eventually lead to non-uniform gas delivery via the gas distribution holes.

To mitigate or prevent such effects, the feed passage that provides process gas to an immediately downstream partial radially symmetric gas distribution feature from a feed riser port may be designed to have a longer length than a feed passage that provides process gas to an immediately downstream radially symmetric gas distribution feature from that same feed riser port. For example, in FIG. 12, it can be seen that two of the three first feed spoke passages 134 radiating out from each of the first feed plenums 130 are approximately twice as long in length as the remaining first feed spoke passage 134 radiating out from each of the first feed plenums 130; this increased length increases the flow resistance of these first feed spoke passages 134, thereby causing the flow rate to the first feed riser ports 138 located at the ends of these first feed spoke passages 134 to experience approximately half the flow rate as the first feed riser port 138 for the remaining first feed spoke passage 134 radiating out from each first feed plenum 130. Similarly, one of the four second feed spoke passages 136 radiating out from each second feed plenum 132 has an increased length as compared with the other second feed spoke passages 136 radiating out therefrom; this has a similar effect and may cause the partial radially symmetric gas distribution features on the immediately downstream layer having only three spokes to experience reduced fluid flow, thereby promoting gas flow uniformity out of the DPF showerhead 100.

After the gas reaches each gas distribution feature, the gas flow may be generally evenly split between the various spoke passages therefor before passing to the next set of gas distribution features in the immediately downstream layer (or out through the gas distribution ports); this recursive splitting characteristic serves to evenly distribute the process gases across a wide area of the showerhead. In this example, there are three fractal layers 122, although more or fewer such layers may be used depending on how finely or coarsely the gas is to be distributed.

In the example DPF showerhead 100, it can be seen that the radially symmetric gas distribution features in a given fractal layer 122 for each plenum have spoke passages that are aligned with passage axes that are 45° out of phase with each other. For example, in the fractal layer 116*d* of FIG. 5, the first radially symmetric gas distribution features 146 have first spoke passages 154 that are aligned with first passage axes 150 and the second radially symmetric gas distribution features 148 have second spoke passages 156 that are aligned with second passage axes 152; the first passage axes 150 and the second passage axes 152, as can be seen, are 45° out of phase with each other.

Figure 16:
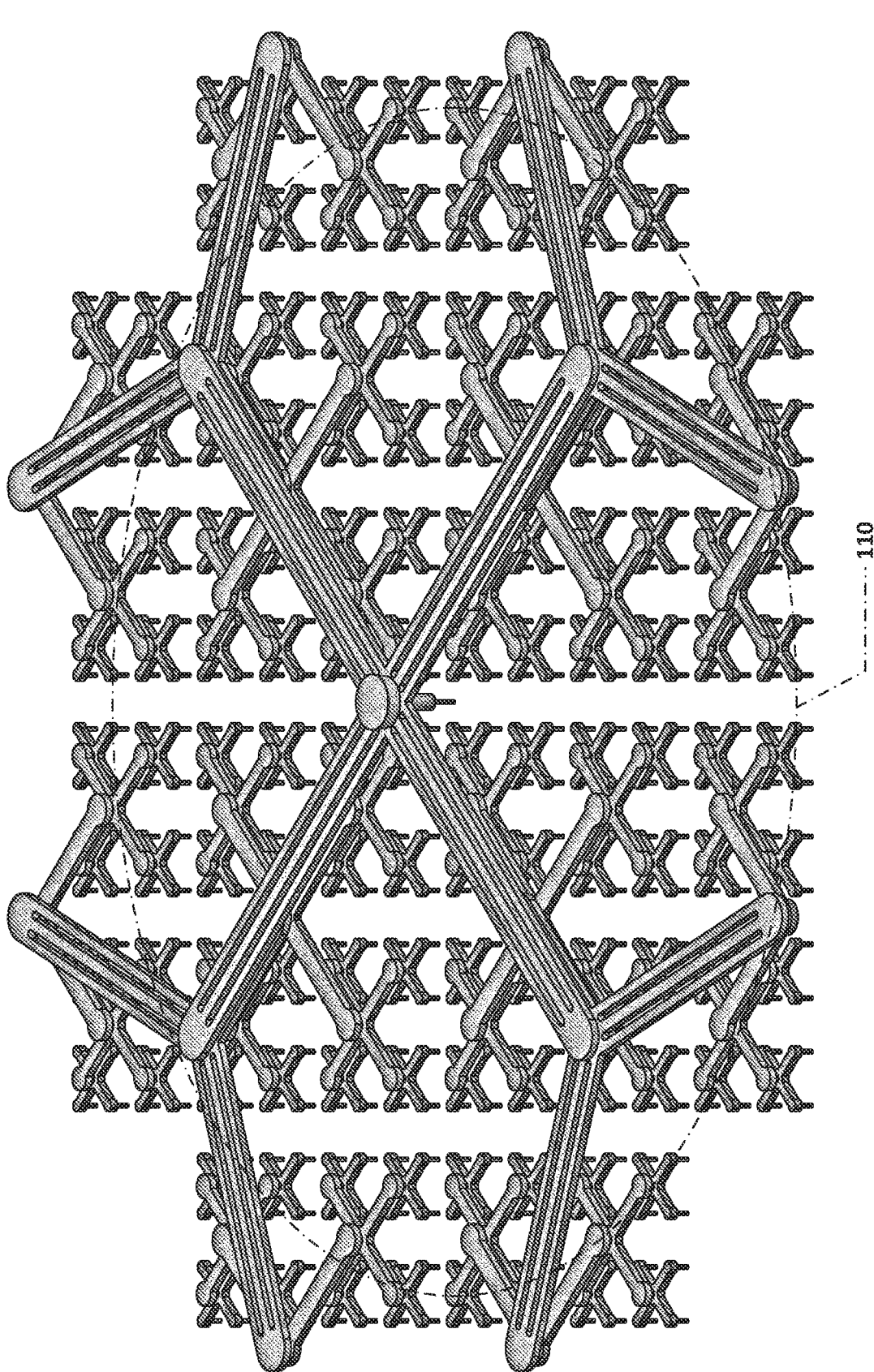
FIG. 16 depicts an isometric view of one of the plenum volumes within the example dual-plenum fractal showerhead of FIG. 1.
Figure 17:
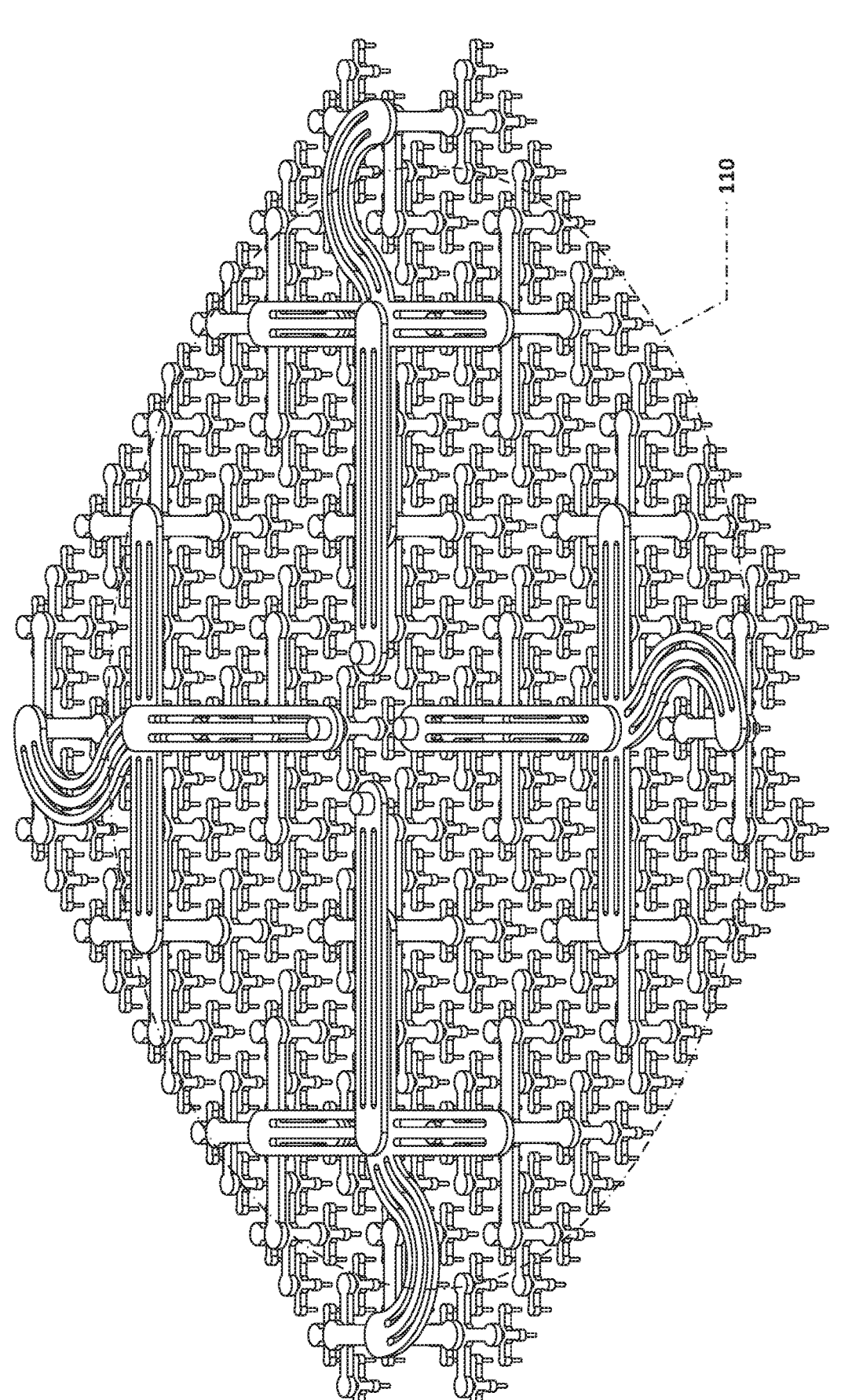
FIG. 17 depicts an isometric view of the other of the plenum volumes within the example dual-plenum fractal showerhead of FIG. 1.
Figure 18:
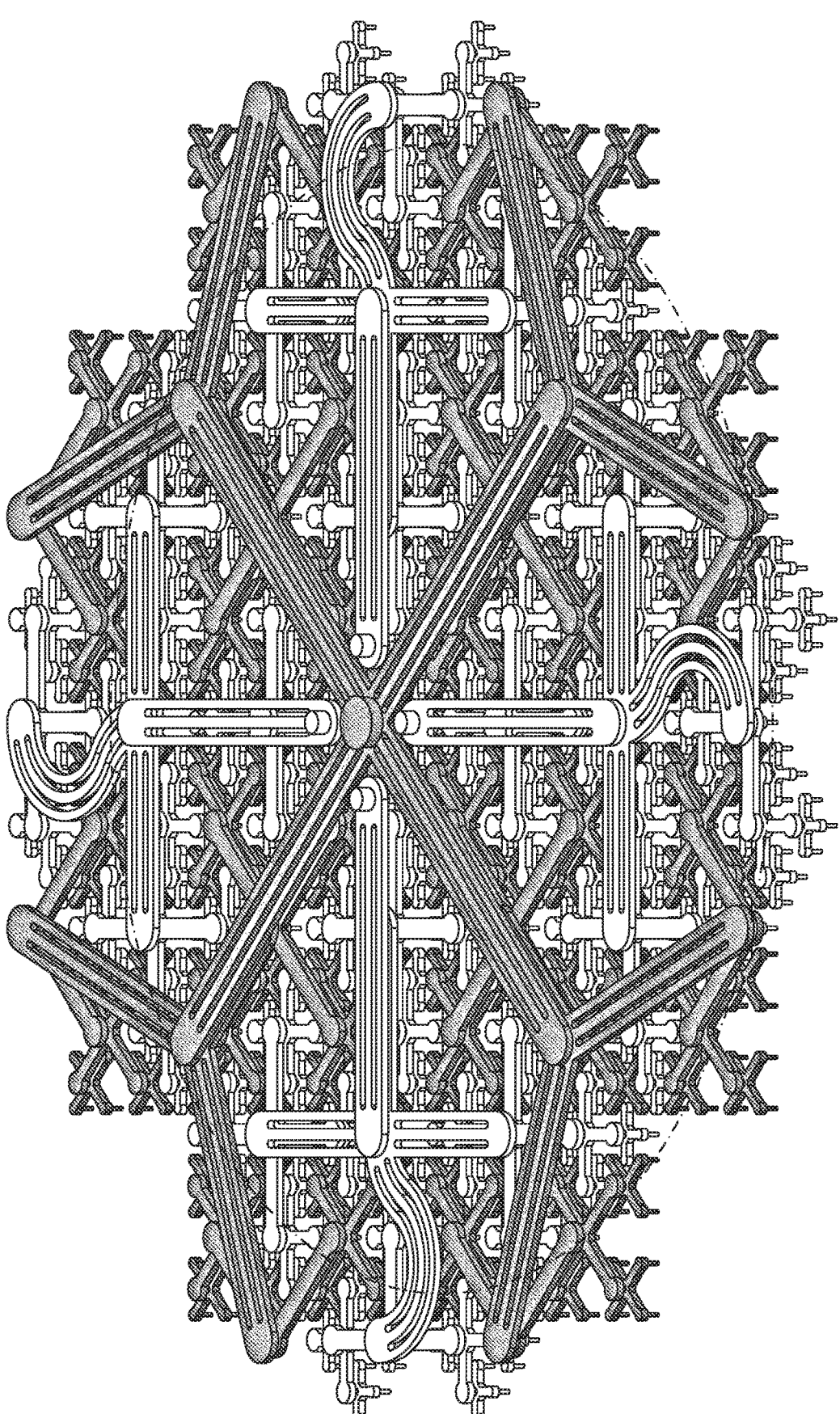
FIG. 18 depicts an isometric view of both plenum volumes within the example dual-plenum fractal showerhead of FIG. 1.

FIG. 16 depicts an isometric view of an abstraction of one of the plenum volumes within the example dual-plenum fractal showerhead of FIG. 1. FIG. 17 depicts an isometric view of an abstraction of the other of the plenum volumes within the example dual-plenum fractal showerhead of FIG. 1. FIG. 18 depicts an isometric view of abstractions of both plenum volumes within the example dual-plenum fractal showerhead of FIG. 1.

In FIGS. 16 through 18, it can be readily seen that each radially symmetric gas distribution feature or partial radially symmetric gas distribution feature in the fractal layers has a hub plenum that is fluidically connected with a riser port at the distal end of one of the spoke passages radiating out from the hub plenum of a radially symmetric gas distribution feature in the immediately upstream fractal layer (or with a feed riser port in one of the feed layers 120). Due to the 45° out-of-phase arrangement of the radial spoke passages from each plenum within each layer, it is also possible to achieve a very high density of gas distribution holes on the bottom face of the DPF showerhead while still achieving generally equal flow resistance from the inlet(s) to any of the gas distribution ports for either plenum. For example, such a configuration permits each of various second spoke passages 156 to partially extend into the space between two neighboring adjacent first spoke passages 154, thereby allowing the each of the associated second riser ports 164 (or the second gas distribution holes 108 in layer 116*f*) to be positioned midway along a line between the two first riser ports 162 (or first gas distribution holes 106) that are closest to that second riser port.

It will also be noted that, in the example DPF showerhead, there are a number of gas distribution holes and/or radially symmetric gas distribution features that lie outside of the wafer overlap area 110 and would thus provide process gas that generally would likely never actually encounter the wafer since the process gas delivered from the radially symmetric gas distribution features and/or gas distribution holes within the wafer overlap area 110 would tend to push such process gas outwards and away from the wafer. As such, the process gas delivered from gas distribution holes outside of the wafer overlap area 110 may, in essence, be viewed as excess or waste process gas. As mentioned above, in some implementations the gas distribution holes that are located outside of the wafer overlap area may be reduced in number or eliminated to reduce or eliminate the amount of excess or waste gas produced by a DPF showerhead. However, doing so may require extensive customization of the various radially symmetric gas distribution features (in fact, they may no longer be reasonably considered to be "radially symmetric gas distribution features" as a result) used to ensure that the gas flow through the gas distribution holes remains uniform. By including the radially symmetric gas distribution features and/or gas distribution holes that lie outside of the wafer overlap area 110, the flow-splitting that occurs at each radially symmetric gas distribution feature remains the same for all radially symmetric gas distribution features in the fractal layers, thereby producing uniform flow through the gas distribution holes for each plenum without the need for complicated modifications to the radially symmetric gas distribution features in the fractal layers 122. It is also noted that as the radially symmetric gas distribution features shrink more and more in overall size, they may be more and more susceptible to minor dimensional variations, making it more and more difficult to individually fine-tune the gas flow characteristics of each radially symmetric gas distribution feature through customization. Thus, while the approach shown with respect to the example DPF showerhead 100 may result in some excess or waste gas, the resulting process gas distribution across the wafer is generally uniform without needing to custom tailor the radially symmetric gas distribution features in the fractal layers.

As noted earlier, there is one gas distribution hole that is not part of either hole pattern on the underside of the DPF showerhead 100—the center hole. Such a center hole may optionally be included to promote additional wafer processing uniformity and may be fluidically connected with, for example, the first plenum inlet. Depending on the particular process conditions needed, it may be desirable to size the center hole to be the same size as the other gas distribution holes for the first plenum or, alternatively, larger or smaller than those other gas distribution holes. In implementations where the center hole is used and is the same size as the other first gas distribution holes, the flow rate through the center hole may, in some such implementations, be modified by altering the flow path resistance through the showerhead from the first gas inlet to the center hole; it need not have the same flow resistance as the other first gas distribution holes of the first plenum.

It will be further noted that while this disclosure has primarily been directed at a dual-plenum fractal showerhead, similar principals may be implemented in a single-plenum fractal showerhead format, e.g., by simply omitting one of the plenums and associated features. Such single-plenum fractal (SPF) showerheads are also considered within the scope of this disclosure.

Figure 19:
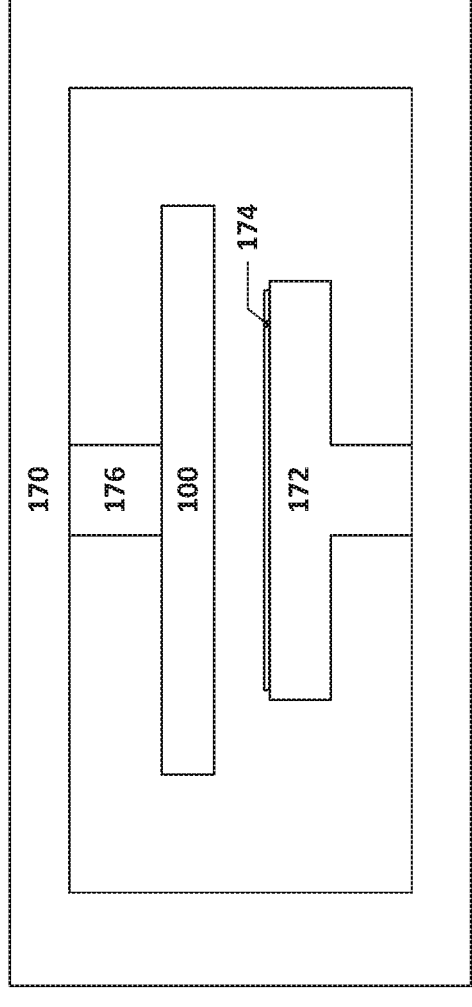
FIG. 19 depicts a schematic of a semiconductor processing chamber with a showerhead as described herein.

DPF (and SPF) showerheads according to the concepts discussed herein may, as discussed earlier, be used in semiconductor processing operations. For example, a DPF or SPF showerhead may be used in a semiconductor processing chamber, such as semiconductor processing chamber 170 in FIG. 19. Such a DPF or SPF showerhead 100 may be suspended within the chamber 170 via a stem 176, which may include gas supply passages for delivering process gas to the inlets of the DPF or SPF showerhead for distribution across a wafer 174 that may be supported within the chamber 170 by a pedestal 172.

In some implementations, a controller may be provided. The controller may be part of a system that may include the above-described examples, and may be operatively connected with various valves, mass flow controllers, pumps, etc. so as to be able to receive information from and/or control such equipment. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of various gases, such as to a DPF or SPF showerhead as described herein, temperature settings (e.g., heating and/or cooling), pressure settings, vacuum settings, power settings, flow rate settings, fluid delivery settings, and positional and operation settings.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some implementations, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory. For the purposes of this disclosure, the term "fluidically connected" is used with respect to volumes, plenums, holes, etc., that may be connected with one another in order to form a fluidic connection, similar to how the term "electrically connected" is used with respect to components that are connected together to form an electric connection. The term "fluidically interposed," if used, may be used to refer to a component, volume, plenum, or hole that is fluidically connected with at least two other components, volumes, plenums, or holes such that fluid flowing from one of those other components, volumes, plenums, or holes to the other or another of those components, volumes, plenums, or holes would first flow through the "fluidically interposed" component before reaching that other or another of those components, volumes, plenums, or holes. For example, if a pump is fluidically interposed between a reservoir and an outlet, fluid that flowed from the reservoir to the outlet would first flow through the pump before reaching the outlet.

It is to be further understood that the general term "riser port" may be used herein to not only refer to the riser ports for each radially symmetric gas distribution feature, but may also be used herein to refer to feed riser ports and gas distribution holes. Thus, for example, a gas distribution hole may be described not only as a gas distribution hole, but also as a riser port. Similarly, a feed riser port may also simply be referred to as a riser port. Generally speaking, riser ports on the lowermost surface of a DPF or SPF showerhead (when the showerhead is installed in a processing chamber) may also be referenced as "gas distribution holes."

It is to be understood that the phrases "for each <item> of the one or more <items>," "each <item> of the one or more <items>," or the like, if used herein, are inclusive of both a single-item group and multiple-item groups, i.e., the phrase "for . . . each" is used in the sense that it is used in programming languages to refer to each item of whatever population of items is referenced. For example, if the population of items referenced is a single item, then "each" would refer to only that single item (despite the fact that dictionary definitions of "each" frequently define the term to refer to "every one of two or more things") and would not imply that there must be at least two of those items.

It is also to be understood that reference to a "layer" in the present disclosure may refer to either a physically separable layer, e.g., a ply in a laminated structure that is then bonded, fused, or other otherwise fixed in position relative to another ply in the laminated structure, or, more generally, to a region of a structure that is bounded between two reference surfaces; such a structure may be composed of multiple components assembled or bonded together or may, in some instances, be a monolithic structure, e.g., a single-piece structure. For example, a cast or additively manufactured single-piece part may still be considered to have features on different "layers" thereof even though the part was not created by actually bonding together physically separate layers (although the argument may be made that most additively manufactured parts inherently possess a layered construction since they are typically printed one thin layer at a time). It will also be recognized that a "layer" of a part that actually is manufactured as a laminate, i.e., out of discrete layers, may not necessarily align with one of those discrete layers. For example, a layer of a part may be defined so as to include only a portion of such a discrete layer part, portions of two adjacent discrete layer parts, or portions of one or two non-adjacent discrete layer parts as well as the discrete layer parts thereinbetween.

What is claimed is:

1. A semiconductor processing apparatus comprising:
a showerhead, the showerhead including:
  a body;
  a first plenum inlet;
  a second plenum inlet;
  a plurality of first gas distribution holes; and
  a plurality of second gas distribution holes, wherein:
    the body includes a plurality of layers, the plurality of layers including a subset of two or more fractal layers, each fractal layer including a set of first radially symmetric gas distribution features and a set of second radially symmetric gas distribution features,
    the first radially symmetric gas distribution features and the second radially symmetric gas distribution features are fluidically isolated from one another within the body,
    each first radially symmetric gas distribution feature includes a first hub plenum, a plurality of first spoke passages that are fluidically connected to the first hub plenum and that radiate outward from the first hub plenum to respective distal ends of the first spoke passages, and a plurality of first riser ports, each first riser port located at the distal end of one of the first spoke passages,
    each second radially symmetric gas distribution feature includes a second hub plenum, a plurality of second spoke passages that are fluidically connected to the second hub plenum and that radiate outward from the second hub plenum to respective distal ends of the second spoke passages, and a plurality of second riser ports, each second riser port located at the distal end of one of the second spoke passages, and
    for each fractal layer of the fractal layers:

each first radially symmetric gas distribution feature of that fractal layer is positioned such that the corresponding first hub plenum is positioned beneath a first riser port of the immediately upstream layer, each second radially symmetric gas distribution feature of that fractal layer is positioned such that the corresponding second hub plenum is positioned beneath a second riser port of the immediately upstream layer, and each of the distal ends of each of the second radially symmetric gas distribution features within a first region of each of the fractal layers is interposed between adjacent distal ends of one or more of the first radially symmetric gas distribution features of that fractal layer and within the first region of that fractal layer.

2. The semiconductor processing apparatus of claim 1, wherein:

one of the fractal layers also includes a set of first partial radially symmetric gas distribution features, each first partial radially symmetric gas distribution feature having a first hub plenum with a lesser number of first spoke passages fluidically connected therewith compared with any of the first radially symmetric gas distribution features of that fractal layer.

3. The semiconductor processing apparatus of claim 2, wherein the body further includes a feed layer immediately upstream of the fractal layer with the set of first partial radially symmetric gas distribution features, wherein:

the feed layer includes a plurality of first feed plenums, each first feed plenum having a one or more of first feed spoke passages fluidically connected therewith, each first feed spoke passage having a first feed riser port at a distal end thereof, each first feed riser port positioned above, and fluidically connected with, a corresponding one of the first hub plenums in the fractal layer immediately downstream from the feed layer, the first feed spoke passages that have first feed riser ports that are fluidically connected with first hub plenums of the first radially symmetric gas distribution features in the fractal layer immediately downstream of the feed layer each have a first length, and the first feed spoke passages that have first feed riser ports that are fluidically connected with first hub plenums of the first partial radially symmetric gas distribution features in the fractal layer immediately downstream of the feed layer each have lengths longer than the first length.

4. The semiconductor processing apparatus of claim 3, further comprising:

a processing chamber; and a pedestal, wherein:

the pedestal is positioned within the processing chamber, and the showerhead is positioned within the processing chamber above the pedestal.

5. The semiconductor processing apparatus of claim 2, wherein:

the fractal layer with the set of first partial radially symmetric gas distribution features also includes a set of second partial radially symmetric gas distribution features, each second partial radially symmetric gas distribution feature having a second hub plenum with a lesser number of second spoke passages compared with any of the second radially symmetric gas distribution features of that fractal layer.

6. The semiconductor processing apparatus of claim 5, further comprising:

a processing chamber; and a pedestal, wherein:

the pedestal is positioned within the processing chamber, and the showerhead is positioned within the processing chamber above the pedestal.

7. The semiconductor processing apparatus of claim 5, wherein the body further includes a feed layer immediately upstream of the fractal layer with the set of first partial radially symmetric gas distribution features and the set of second partial radially symmetric gas distribution features, wherein:

the feed layer includes a plurality of first feed plenums and a plurality of second feed plenums, each first feed plenum having one or more first feed spoke passages fluidically connected therewith and each second feed plenum having one or more second feed spoke passages fluidically connected therewith, each first feed spoke passage having a first feed riser port at a distal end thereof and each second feed spoke passage having a second feed riser port at a distal end thereof, each first feed riser port positioned above, and fluidically connected with, a corresponding one of the first hub plenums in the fractal layer immediately downstream from the feed layer, each second feed riser port positioned above, and fluidically connected with, a corresponding one of the second hub plenums in the fractal layer immediately downstream from the feed layer, the first feed spoke passages that have first feed riser ports that are fluidically connected with first hub plenums of the first radially symmetric gas distribution features in the fractal layer immediately downstream of the feed layer each have a first length, the first feed spoke passages that have first feed riser ports that are fluidically connected with first hub plenums of the first partial radially symmetric gas distribution features in the fractal layer immediately downstream of the feed layer each have lengths longer than the first length, the second feed spoke passages that have second feed riser ports that are fluidically connected with second hub plenums of the second radially symmetric gas distribution features in the fractal layer immediately downstream of the feed layer each have a second length, and the second feed spoke passages that have second feed riser ports that are fluidically connected with second hub plenums of the second partial radially symmetric gas distribution features in the fractal layer immediately downstream of the feed layer each have lengths longer than the second length.

8. The semiconductor processing apparatus of claim 7, further comprising:

a processing chamber; and a pedestal, wherein:

the pedestal is positioned within the processing chamber, and the showerhead is positioned within the processing chamber above the pedestal.

9. The semiconductor processing apparatus of claim 2, further comprising:

a processing chamber; and a pedestal, wherein:

the pedestal is positioned within the processing chamber, and the showerhead is positioned within the processing chamber above the pedestal.

10. The semiconductor processing apparatus of claim 1, wherein the first radially symmetric gas distribution features of the fractal layers each include four first spoke passages and the second radially symmetric gas distribution features of the fractal layers each include four second spoke passages.

11. The semiconductor processing apparatus of claim 10, wherein for each fractal layer of one or more of the one or more fractal layers, the first spoke passages and the second spoke passages for the first radially symmetric gas distribution features and the second radially symmetric gas distribution features, respectively, of that fractal layer are at the same elevation.

12. The semiconductor processing apparatus of claim 10, wherein, for each fractal layer of the fractal layers:

the first spoke passages are each aligned with one of two orthogonal first passage axes, the second spoke passages are each aligned with one of two orthogonal second passage axes, and the first passage axes are 45° out-of-phase with the second passage axes.

13. The semiconductor processing apparatus of claim 10, wherein, for each of the fractal layers with an immediately upstream fractal layer, the first radially symmetric gas distribution features of that fractal layer each have center-to-center spacings between the corresponding first riser ports thereof that are approximately 50% of the corresponding center-to-center spacings between first riser ports in the first radially symmetric gas distribution features of the immediately upstream fractal layer.

14. The semiconductor processing apparatus of claim 10, wherein, for each of the fractal layers with an immediately upstream fractal layer, the second radially symmetric gas distribution features of that fractal layer each have center-to-center spacings between the corresponding second riser ports thereof that are approximately 50% of the corresponding center-to-center spacings between second riser ports in the second radially symmetric gas distribution features of the immediately upstream fractal layer.

15. The semiconductor processing apparatus of claim 10, further comprising:

a processing chamber; and a pedestal, wherein:

the pedestal is positioned within the processing chamber, and the showerhead is positioned within the processing chamber above the pedestal.

16. The semiconductor processing apparatus of claim 1, wherein there are at least three fractal layers.

17. The semiconductor processing apparatus of claim 1, wherein the body is made from a ceramic material.

18. The semiconductor processing apparatus of claim 17, wherein the body is made from multiple discrete layers of ceramic material that are fused together.

19. The semiconductor processing apparatus of claim 12, wherein the body is a 3D-printed structure.

20. The semiconductor processing apparatus of claim 1, further comprising:

a processing chamber; and a pedestal, wherein:

the pedestal is positioned within the processing chamber, and the showerhead is positioned within the processing chamber above the pedestal.

\* \* \* \* \*